United States Patent [19]
Koguchi et al.

[11] Patent Number: 5,578,824
[45] Date of Patent: Nov. 26, 1996

[54] IMAGE FORMING SYSTEM

[75] Inventors: Hideyuki Koguchi, Kanagawa; Yoshiharu Sasaki, Shizuoka, both of Japan

[73] Assignee: Fuji Photo Film Co., Ltd., Kanagawa, Japan

[21] Appl. No.: 427,102

[22] Filed: Apr. 21, 1995

[30] Foreign Application Priority Data

Apr. 22, 1994 [JP] Japan .................................. 6-084800

[51] Int. Cl.$^6$ ...................................................... G03C 5/16
[52] U.S. Cl. ............................................ 250/318; 250/319
[58] Field of Search .............................. 250/316.1, 317.1, 250/318.1

[56] References Cited

U.S. PATENT DOCUMENTS

| | | | |
|---|---|---|---|
| 4,482,625 | 11/1984 | Namiki et al. . | |
| 4,500,919 | 2/1985 | Schreiber | 358/78 |
| 4,661,703 | 4/1987 | Ishikawa et al. | 250/318.1 |
| 4,893,010 | 1/1990 | Tomatsu | 250/318.1 |
| 5,126,760 | 6/1992 | DeBoer | 250/317.1 |
| 5,198,409 | 3/1993 | Rowan et al. | 503/227 |
| 5,264,867 | 11/1993 | DeCook et al. | 250/317.1 |
| 5,266,441 | 11/1993 | Kondo et al. | 430/201 |
| 5,352,562 | 10/1994 | Takahashi et al. | 430/253 |

FOREIGN PATENT DOCUMENTS

| | | |
|---|---|---|
| WO9217982 | 10/1992 | European Pat. Off. . |
| 0648042 | 4/1995 | European Pat. Off. . |
| 59-97140 | 6/1984 | Japan . |

Primary Examiner—Bruce C. Anderson
Attorney, Agent, or Firm—Sughrue, Mion, Zinn, Macpeak & Seas

[57] ABSTRACT

A donor sheet having at least a thin image-forming film on a support is brought into a superposed relationship with an image-receiving material having an image-receiving layer provided on a support either directly or with at least one cushion layer interposed in such a way that the thin film faces the image-receiving layer, and thermal energy is applied imagewise onto the donor sheet, which is then peeled from the image-receiving material to form an image on the latter. Donor sheets having a plurality of peelable thin films are combined selectively with different image-forming materials to insure that at least operations selected from among color image formation, mask image formation, plate-making and filter preparation are possible.

7 Claims, 7 Drawing Sheets

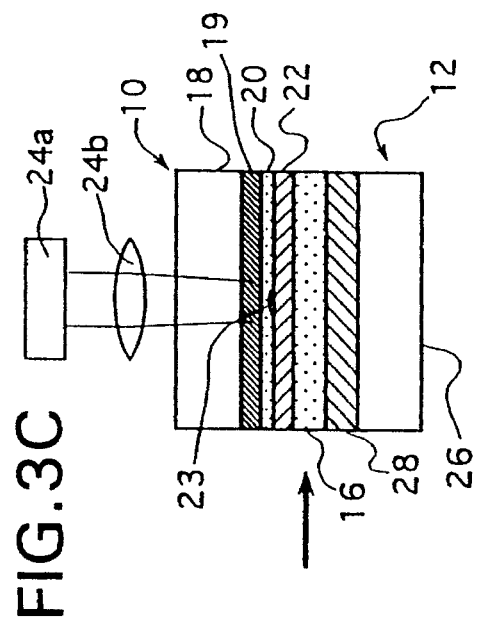
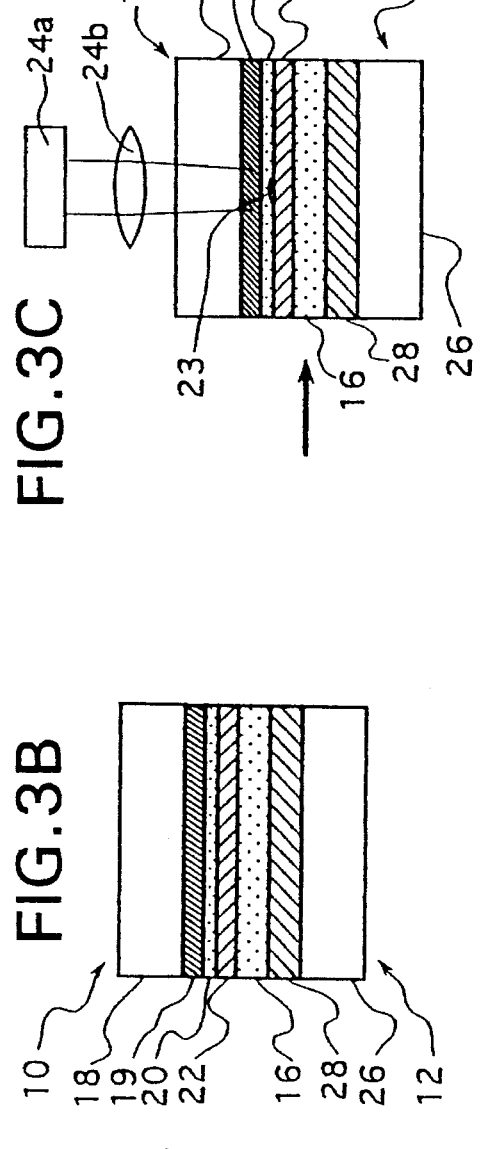
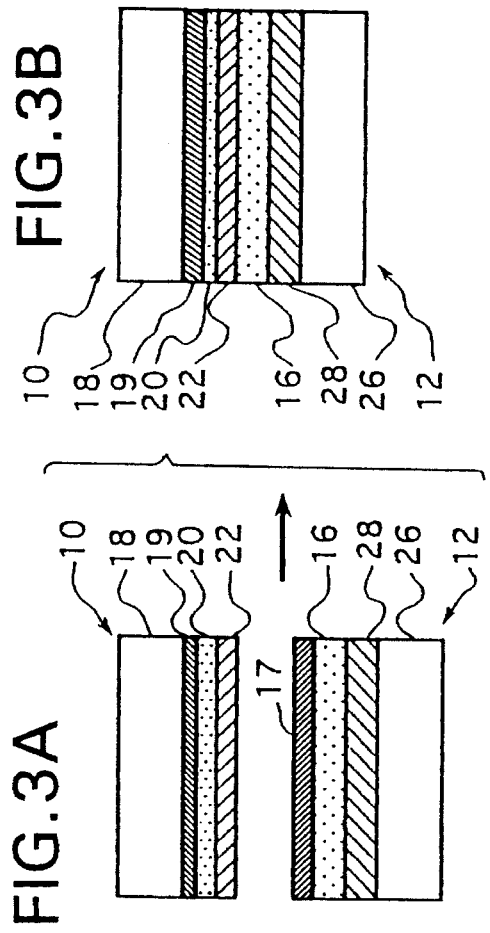
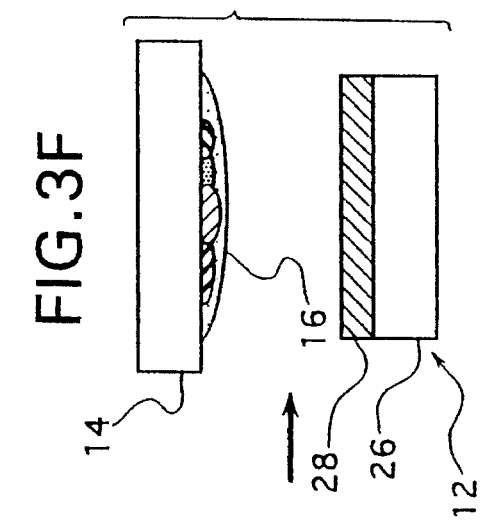
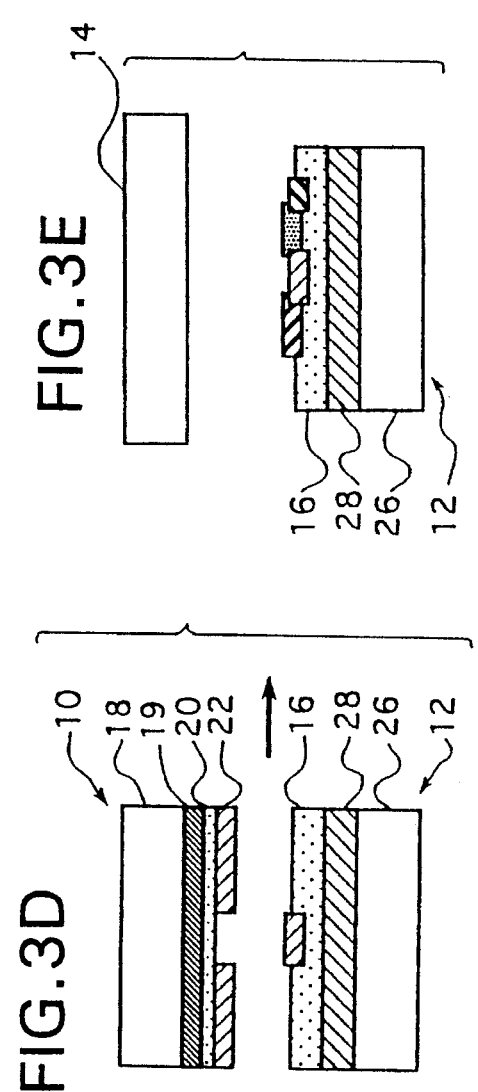
FIG.3A FIG.3B FIG.3C FIG.3D FIG.3E FIG.3F

IMAGE FORMING SYSTEM

BACKGROUND OF THE INVENTION

This invention relates to a multifunction image-forming system that applies thermal energy imagewise to a donor sheet having a thin film, that allows the imagewise thin film to be transferred from the donor sheet onto an image-receiving material by peel/transfer so as to form an area-modulated image and/or a line image such as characters, and that enables various operations such as color image formation, particularly the preparation of direct digital color proofs (DDCP) in the printing area, black-and-white image formation, platemaking, filter production and printed wiring board (PWB) fabrication. The invention also relates to an image forming system that has the multifunction image forming capability combined with a color management system for input/output (I/O) device profile matching so that an image can be formed selectively by either laser head recording in a heating mode or by thermal recording with a thermal head in accordance with the required image quality.

A color image read from originals such as photographs and pictures or color image data supplied from a given image input device is subjected to desired processing to produce a CRT display, which is then delivered as a hard copy from an image recording apparatus or processed via a plate to produce a print. Color management or image forming systems that have these capabilities are extensively used today.

To make a print, color separation films for Y, M, C and K are first prepared on the basis of color image data as supplied from an image input device; then, a plate such as a PS (presensitized) plate is exposed through those color separation films, developed and set up on a press which is operated to produce prints. Obviously, this procedure involves a number of steps. In addition, the color of the final print depends on printing conditions including the types of the paper, ink, water and printing press used, the number of screen lines used to form halftone images, and the shape of dots in halftone image.

While plates are exposed through a set of color separation films that are produced from color originals with the aid of lith films, it is common practice today to produce a color proof from the color separation films and check for any errors that may have occurred in the color separation step or to check for the need to perform color correction. To insure approximation of what can be expected on press, it is generally held preferable to prepare the color proof by forming an image on the same paper as is used to make the final print and by using pigments as colorants. Other requirements are high resolution that enables faithful reproduction of halftone image, as well as high process stability. A dry proof production method which does not use liquid developers is a technique that is particularly needed these days. Additionally, with the recent expansion of electronic systems into the pre-press area, there is a growing demand for materials and systems that are capable of direct color proofing in response to digital signals.

With a view to producing color proofs by the dry method, there has been proposed a heat transfer recording process, in which a thermal head furnished with a number of heat generating elements is pressed against an image-receiving sheet via an ink sheet and the heat generating elements are selectively activated to generate heat in response to an image signal; the ink transfer layer in the ink sheet is discretely softened to melt or vaporized to sublime so that the ink is transferred in dots onto the image-receiving sheet, whereby the image is recorded. An apparatus, commonly referred to as a thermal printer, for forming an image by the heat transfer recording process has also been proposed.

The selective heating of the ink sheet in response to an image signal in the heat transfer recording process may be effected by laser-emitted light of high-density energy rather than by the heat-generating elements in the thermal head and this method has been proposed as "laser recording" in a heating mode. Thermal recording by means of a thermal head is limited in resolution but has the advantage of permitting high-speed image recording in a simple manner; on the other hand, laser recording in a heating mode is not as fast in recording a single full frame, however, it enables image recording at high resolution.

In heat transfer recording by either a thermal head or a laser operating in a heating mode, color images can be produced by performing multiple transfer recording on an image-receiving sheet from an ink sheet or ink sheets with three colors, yellow (Y), magenta (M) and cyan (C), or four colors, Y, M, C and K (black), to produce one print. If necessary, the time of electric current application to the heat generating elements in the thermal head or to the laser, hence, the time of heat generation by the thermal head or the time of light emission from the laser, may be controlled so as to modulate the amount or area of the ink that is to be softened to melt or vaporized to sublime, whereby either the ink density or the area of halftone (dots) is modulated to produce density gradations in individual pixels.

As described above, complicated process steps and conditions are involved in the printing area and, given image data that have been subjected to desired image processing in accordance with image reading conditions (i.e., entered image conditions), individual image input devices such as image reading apparatus have unavoidable differences in characteristics or capabilities, and so do image output devices such as image recording apparatus and printers. Under the circumstances, it is desired to develop a system which, either prior to or without color proofing, produces a CRT or otherwise display of color image data that have been subjected to desired image processing so that the image quality of the finally obtainable print can be verified on CRT with high precision.

Color management systems adapted for this purpose are described in U.S. Pat. No. 4,500,919 and International Patent Publication WO 92/17982; according to the disclosed systems, many combinations of colorants in various quantities are printed and, on the basis of their colorimetric measurements, a color reproduction signal is corrected to attain a match between the color image on print and the displayed color image. Also disclosed in those patents are methods in which, following the colorimetric registration, a white point in the color image on print is brought into registry with a displayed white point, thereby assuring enhanced color matching.

Conventionally used ink sheets are either softenable to melt or vaporizable to sublime. A meltable ink sheet comprises a base carrying a transfer layer (image-forming layer) that has a colorant incorporated in a binder selected from among waxes and other low-melting point substances that are solid at ordinary temperatures and which will soften or melt upon heating. A sublimable ink sheet is different from the meltable ink sheet in that it uses a thermally sublimable substance as the binder. Hence, the transfer layer in the ink sheet, whether it is meltable or sublimable, is usually thicker than 3 μm, sometimes as thick as 20–40 μm, requiring considerable energy to have the binder sublime or melt with heat; further, there is a limit to the maximum image resolution that can be achieved and the edges of halftone dots may become blurred or jagged to reduce the stability of small dots.

The use of a sublimable ink sheet presents an additional problem. Since ink density, or the amount of ink sublimation for transfer, is dependent on thermal energy, it is not easy to achieve precise control over the intensity of thermal energy to be applied to the ink layer and instability will accompany density modulation. When a meltable ink sheet is used, the great film thickness of the sheet causes instability due to thermal diffusion.

Thus, with the conventional thick-film ink sheets, the effective thermal energy concentration that can be produced by laser light is limited even if the beam spot size is reduced and image resolution cannot be increased beyond a certain level. As a result, it has been impossible to switch one to another between thermal recording with a thermal head and laser head recording in a heating mode depending upon the required image quality.

If colorants are the sole factor in matching, correct color reproduction is possible with the above-described conventional color management systems. However, when producing prints, output conditions such as the type of the support for prints, the number of colors to be employed, the amount of K (black) and the number of screen lines must also be set and, what is more, the press conditions (e.g. the order of printing, printing pressure, the amount of colorant and printing speed) must be set appropriately. In fact, it has been difficult for the prior art technologies to provide good performance with high precision under versatile printing conditions.

SUMMARY OF THE INVENTION

The present invention has been accomplished under these circumstances and has as the principal object providing an image forming system which, when forming image on a novel image-receiving material by a process in which a novel donor sheet having an extremely thin, preferably 0.1–2 μm thick, peelable film is given an imagewise pattern of energy so that the thin film is peeled imagewise, and subsequently transferred onto the image-receiving material for image formation, more than one type of the thin film in the donor sheet is combined with more than one type of the image-receiving material in various ways so that the system performs versatile functions including color image formation, black-and-white image formation, platemaking, filter preparation and PWB fabrication.

Another object of the invention is to provide an image forming system which not only attains the primary object described above but also has the following capabilities: i) when colorants are contained in the thin film in the donor sheet, a color proof that is a very good approximation of the final print can be produced directly by means of either laser light or heat of thermal head which is modulated with a digital image signal; ii) color image can be reproduced on CRT or printer with precise color reproduction under various I/O conditions and in accordance with various color reproduction procedures without particular need to worry about the differences in image output devices and media, process steps and other factors; iii) the results of color reproduction can be verified by simulation; iv) any changes, additions and other modifications of I/O conditions and color management system is possible with great flexibility; and v) a color image of a desired color can be easily produced.

These objects of the invention can be attained by its first embodiment, which is an image forming process comprising the steps of:

superposing a donor sheet having at least a thin image-forming film on a support upon an image-receiving material having an image-receiving layer provided on a support either directly or with at least one cushion layer interposed in such a way that said thin image-forming film faces said image-receiving layer;

applying thermal energy imagewise onto said donor sheet so that the adhesion of said thin film to said image-receiving layer is strengthened in the energy applied areas; and peeling said donor sheet from said image-receiving material so that said thin film is transferred onto said image-receiving layer in correspondence to said imagewise application of energy, whereby an image is formed on said image-receiving material;

wherein prior to the step of superposing, selecting said donor sheet from a plurality of one of donor sheets, with each of said donor sheets having a thin image-forming film so that said plurality of donor sheets in turn provides a plurality of thin films containing different substances to be used in combination with said image-receiving material which is selected from a plurality of different image-receiving materials, thereby insuring that at least two operations selected from among color image formation, mask image formation, platemaking and filter preparation are possible.

Preferably, the thin film in the donor sheet has a thickness of 0.1–2 μm. It is also preferred that the thin film in said one donor sheet contains a colorant and a thermoplastic resin as two main components.

The second embodiment of the invention is a version of the above-described first embodiment and provides an image forming system having a device characterization capability for simulating not only color information but also at least one image structural characteristic selected from among texture, S/N ratio and resolution.

Preferably, the simulation is performed optically and/or electrically.

The third embodiment of the invention is a version of the above-described first or second embodiment and provides an image forming system capable of forming an area-modulated image or a character/line image by controlling the application of thermal energy to select between laser head recording in a heating mode or thermal recording with a thermal head in accordance with the quality of the image to be formed.

In each of the first to the third embodiments, the image received by the image-receiving layer in the image-receiving material may be retransferred onto a separate permanent support for practical use.

Processing with the image forming system according to the first embodiment of the invention proceeds as follows: a donor sheet having a novel, unconventionally thin and peelable film is adhered to a novel image-receiving material with a uniform adhesive force under heat and/or pressure that is applied by laminating means; thermal energy is applied imagewise to cause imagewise reduction in the bonding force of the thin film in the donor sheet, so that the force of bond between the thin film in the donor sheet and the support (or the light-heat conversion layer) becomes smaller than the force of adhesion between the thin film in the donor sheet and the image-receiving layer in the image-receiving material, whereby the donor sheet is peeled from the image-receiving material by peel/transfer means without causing uneven peeling the thin film which has experienced the imagewise reduction in the binding force is transferred from the donor sheet onto the image-receiving layer in the image-receiving material for effecting transfer to form an image of thin-film.

Hence, when implementing the image forming system of the invention, donor sheets having many kinds of thin films that are made from different materials to have different characteristics are provided and combined with image-receiving materials having correspondingly appropriate image-receiving layers in such a way that the operator can perform various operations such as color image formation, black-and-white image formation, platemaking, filter preparation and PWB fabrication. Take, for example, the case of using thin colorant films; one may provide donor sheets containing colorants for either the three primary colors, or four colors including black, or more colors further including special colors, and the above-described procedure for forming a monochromatic image is repeated for the colors of interest the necessary times to produce a full color image.

The thus produced full color image is a multi-level image of high quality and resolution that is free from uneven peel, doubling or failure in registration and, hence, it is a sufficiently good approximation of the final print to be optimal for use as a direct digital color proof in the printing area.

The image forming system according to the second embodiment of the invention has such a device characterization capability that given a variety of I/O devices under various I/O conditions, it can simulate not only color information but also either one of image structural characteristics selected from among texture, S/N ratio and resolution. Hence, the system is capable of precise color reproduct and image formation without worrying about the possible differences or variations in I/O devices or I/O conditions associated with I/O media and the like, or the system has reasonable flexibility in enabling any changes, additions and modifications of I/O devices and/or conditions.

If images of high quality with high resolution (>1000 dpi, preferably 1000–4000 dpi) that are capable of reproducing fine details are required, the image forming system according to the third embodiment of the invention selects laser head recording in a heating mode. If, on the other hand, high-speed (quick-access) and low-cost images are required at the sacrifice of image quality (as exemplified by resolutions of 300–600 dpi), the system can select the mode of thermal recording with a thermal head.

In each of the embodiments described above, the image-receiving layer in the image-receiving material may be adapted to be peelable and if this is the case, the image formed on the image-receiving layer can in turn be transferred from the image-receiving material onto a permanent base for actual use.

BRIEF DESCRIPTION OF THE DRAWINGS

FIGS. 3a–3f are sections showing conceptually an example of the color image recording process that uses the color image forming method that may be implemented with the image forming system of the invention;

DETAILED DESCRIPTION OF THE INVENTION

The image forming system of the invention will now be described in detail with reference to the preferred embodiment shown in the attached drawings.

Figure 1:
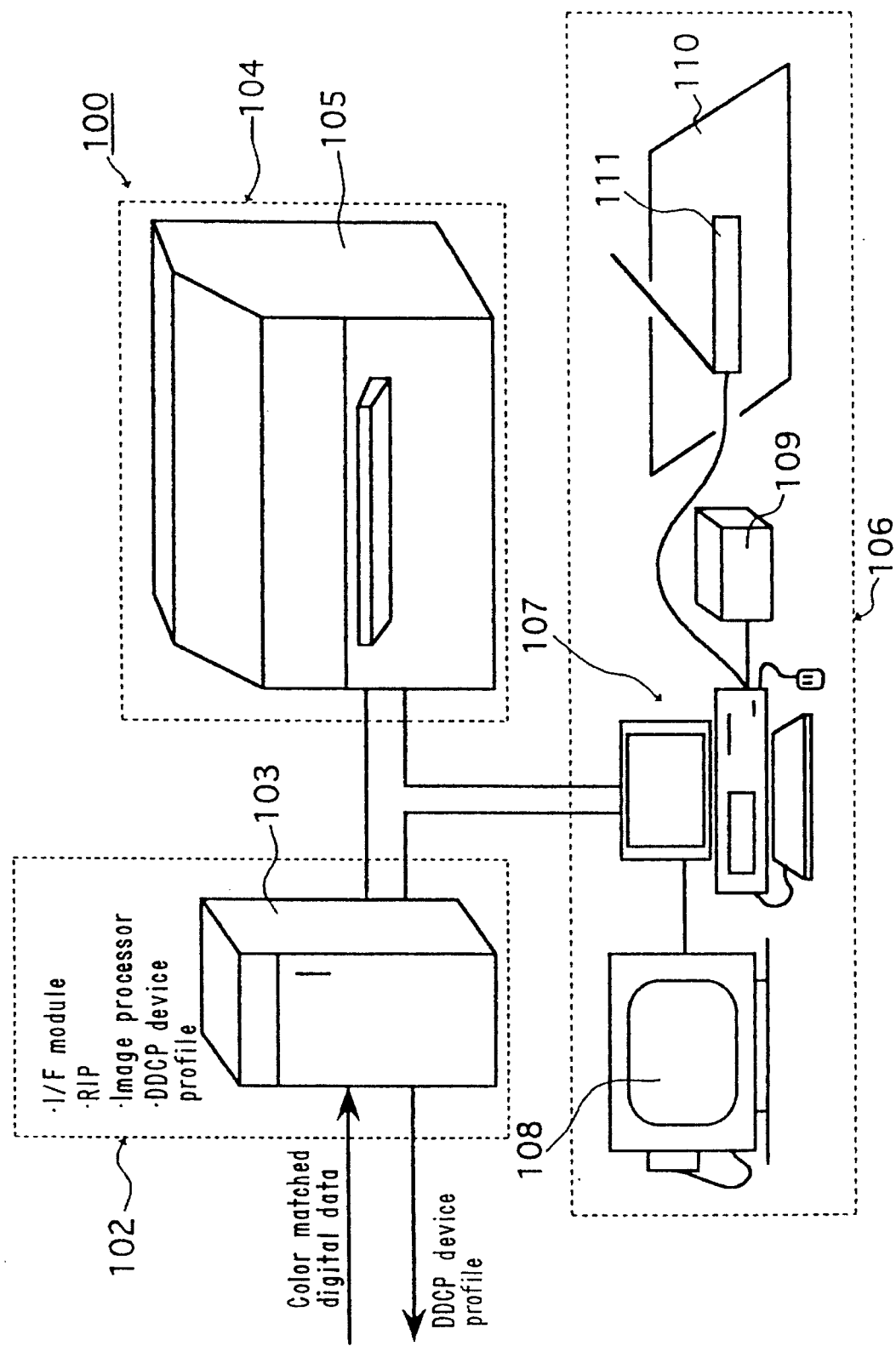
FIG. 1 is a schematic diagram showing conceptually an embodiment of the image forming system of the invention.

FIG. 1 shows schematically the construction of an embodiment of the image forming system of the invention. The image forming system shown in FIG. 1 incorporates the first embodiment of the invention and it is realized as a digital direct color proof producing system (hereunder abbreviated as a "DDCP system"), the general layout of which is shown in FIG. 1. While the following description concerns a DDCP producing system as a typical embodiment of the image forming system, it should of course be understood that this is not the sole case of the invention and may be replaced by other types of color image forming systems, as well as systems for preparing various filters including color filters, UV filters, IR filters and color mosaic filters for use in liquid-crystal displays.

The DDCP producing system generally indicated by 100 in FIG. 1 comprises an interface unit (hereunder referred to as "I/F unit") 102, a recording unit 104, and an operation unit 106. The I/F unit 102 comprises, although not shown, an interface (I/F) module providing an interface between the image input device and each of an image output device 105 in the recording unit 104 and a workstation 107 in the operation unit 106, a raster image processor with which image signal data supplied in various formats such as vector data are processed for raster display, an image processor for performing simple operations such as image rotation, enlargement and reduction, and a memory storing a DDCP device profile which is a data packet of device characters identifying the characteristics, capabilities and the like of a DDCP image output device 105. The recording unit 104 comprises the image output device 105 which produces an image on hard copy. The operation unit 106 comprises basically the workstation (W/S) 107 for performing job management, as well as device profile preparation, change, addition, etc., a color monitor 108 with a calibrator, a metafile output (MO) 109 and other outputs, as well as an on-line densitometer 111 for a calibration sheet 110 as delivered from the image output device 105.

The I/F unit 102 is supplied with color-matched digital image data that have been entered into the image input device from either an original or an external medium. To achieve color matching between the input image and the output image to be delivered from the image output device, the I/F unit 102 supplies the input side or a color management system (CMS) controller or a color image preservation system (CIPS) controller with the DDCP device profile (for its definition, see above) that has been prepared, changed or added by the workstation 107 or which has been retained by the image output device 105 per se. Data such as processed digital image data and device profiles are transmitted between the I/F unit 102 and the image output device 105 in the recording unit 104, between the I/F unit 102 and the W/S 107 in the operation unit 106, and between the W/S 107 and the image output device 105.

The image output device 105 in the recording unit 104 is one of the most characteristic parts of the image forming system of the invention. While details will be given later in this specification, it suffices here to say that the image output device 105 is composed of either a full-color or nonchromatic image forming apparatus comprising a laminator and a digital writer, or a printer, or a thin-film laminating apparatus.

While details will also be given later in this specification, it suffices here to say that in the operation unit 106, job management covering CIPS and CMS is performed with W/S 107 or the color monitor 108 that has higher performance and which is equipped with a calibrator of colors and other parameters; additionally, the calibration sheet 110 delivered as a hard copy is subjected to colorimetry with the on-line densitometer 111 not only for changing or correcting device characters but also for achieving color space matching.

Figure 2:
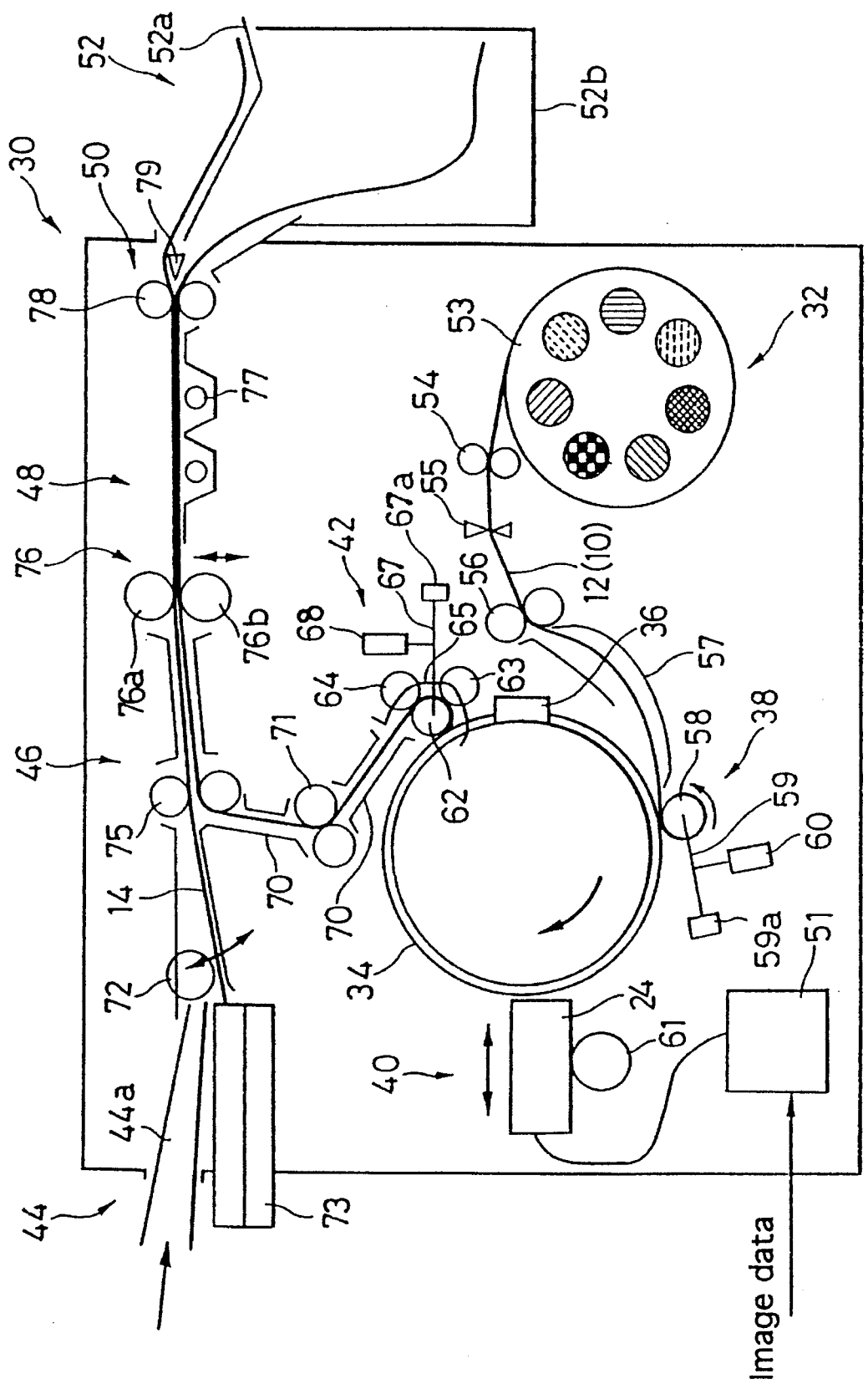
FIG. 2 is a schematic section of an embodiment of a color image forming apparatus for use in the image forming system of the invention.

FIG. 2 shows an embodiment of the color image forming apparatus as a typical case of the image output device 105 in the image forming system 100 of the invention. FIG. 3 shows an example of the color image recording method that may be implemented by the image forming system 100 of the invention. The color image recording method shown in FIG. 3 is a typical example of the case where the image forming method to be implemented with the image forming system of the invention is applied to the color image forming apparatus shown in FIG. 2. While the following discussion is directed to this typical example, it should be understood that this is not the sole case of the invention.

FIG. 2 is a diagrammatic section of an embodiment of the color image forming apparatus of the invention. Before explaining the color image forming apparatus shown in FIG. 2, we will first describe briefly the color image recording method that is applicable to the color image forming apparatus of the invention with reference to FIG. 3. For details of the compositions and the materials of the colorant sheet and image-receiving material that may be used in the color image forming apparatus of the invention, reference should be made to U.S. Pat. No. 5,352,562 and Japanese Patent Application Hei 5-275749.

FIG. 3 shows conceptually an example of the color image recording process that uses the color image recording method that may be implemented with the color image forming apparatus of the invention.

The color image recording method applicable to the invention is a method of recording images using a colorant sheet 10, an image-receiving material 12 and a final receiving sheet 14 which is a permanent image carrier. The method comprises recording an image onto the colorant sheet 10 and transferring it onto an image-receiving layer 16 in the image-receiving material 12 which in turn is transferred (attached) onto the final receiving sheet 14, thereby producing a hard copy from the receiving sheet 14 that has a color image formed thereon. If printing paper or the like is used as the final receiving sheet 14 in the image recording method just described above, one can produce hard copies that are close to actual prints; in addition, as will be described later in detail, images of high quality that are free from "doubling" can be produced consistently and, hence, the invention is applicable with particular advantage to the preparation of color proofs for use in the printing area.

In the example shown in FIG. 3, the colorant sheet 10 comprises a support 18, a light-heat conversion layer 19 that is formed on the support 18 and which contains a substance capable of conversion from light to heat, a heat release layer 20 formed on the light-heat conversion layer 19 and a thin colorant film 22 (hereunder referred to as a "colorant layer") that is formed on the heat release layer 20 and which contains a pigment such as a toner.

The support 18 works to mechanically support the light-heat conversion layer 19, heat release layer 20 and colorant layer 22. To this end, the support 18 is preferably made of a material that not only has high mechanical strength but also high resistance to heat and organic solvents. If it is to be illuminated with light, the support 18 must have high transmittance of light at its wavelength. If a laser is used as a light source and if the laser beam is to be shaped to a spot size of 10 μm or less, the support 18 preferably has a small index of birefringence. As long as it has the characteristics just described above, the support 18 may be in either a sheet or a plate form which are selectively used depending on the object. For use in common applications, the support is preferably in a sheet form which ranges from 2 to 300 μm, preferably from 3 to 150 μm, in thickness.

The support 18 may typically be formed of high-molecular weight compounds including polyethylene terephthalates, polycarbonates, polyethylenes, polyvinyl chloride, polyvinylidene chloride, polystyrenes, and styrene-acrylonitrile copolymers. Biaxially drawn polyethylene terephthalates are particularly preferred from the viewpoints of mechanical strength and dimensional stability under heating.

The support 18 may be surface treated by physical methods such as glow discharge or corona discharge so as to provide better adhesion to the light-heat conversion layer.

Although not shown in FIG. 3, an undercoat may optionally be provided between the support 18 and the light-heat conversion layer 19. The undercoat is preferably formed of a material that provides good adhesion between the support 18 and the light-heat conversion layer 19 and that is more heat-resistant than the heat-release layer 20 to be described later in this specification. In order to minimize the sensitivity drop due to heat conduction to the support 18, polystyrenes and other materials of small heat conductivity are preferred. Considering these conditions and the resistance of the light-heat conversion layer to coating solvents, a suitable undercoat material is selected from among film-forming polymeric materials. While the thickness of the undercoat is not particularly limited, it typically ranges from 0.01 μm to 2 μm. The side of the support 18 which is opposite the light-heat conversion layer 19 may also be coated with an anti-reflection layer or otherwise treated as required.

The light-heat conversion layer 19 used in the invention serves to absorb the light of high-density energy emitted from a light source such as a laser or a xenon lamp that are used as thermal recording means. The light source used as thermal recording means is preferably a laser, more preferably a semiconductor laser such as a laser diode (LD). If a thermal head is used as the thermal heating means, the light-heat conversion layer 19 may be omitted from the colorant sheet 10.

A substance that absorbs the above-described light of high-density energy is contained in the light-heat conversion layer 19. Preferred examples of such substance include black pigments such as carbon black, as well as pigments using phthalocyanines, naphthalocyanines and other macrocyclic compounds that absorb light in the visible to the near-infrared range.

Materials that are used in high-density laser recording such as on optical disks are also used with advantage for the purposes of the invention since they are generally good absorbers of semiconductor laser light. Organic dyes are typical examples and include cyanine dyes such as indolenines, anthraquinone dyes, azulene dyes, phthalocyanine dyes, and organometallic compounds such as dithiol nickel complexes. From the recording sensitivity viewpoint, the light-heat conversion layer 19 is preferably as thin as possible and, hence, cyanine and phthalocyanine dyes having large absorption coefficients at the wavelength of illuminating light are particularly preferred.

Inorganic materials can also be used as light absorbers in the invention. Considering the efficiency of absorption of semiconductor laser light, metallic materials are preferred. When metallic materials are used, the light-heat conversion layer 19 may be formed as a thin film like the one that is deposited by vacuum evaporation; alternatively, the metallic materials may be dispersed in a binder in the same manner as the pigments are used to form the light-heat conversion layer 19.

If metal films are formed by vacuum film forming techniques such as sputtering, the reflectance of light becomes generally high and is not preferred from the viewpoint of sensitivity in laser recording. An effective method commonly adopted to deal with this problem is to provide an anti-reflection effect by superposing the layer of a material (e.g. a chalcogen material) having a different refractive index. Another method that can be employed is to lower the reflectance by forming a film with oxygen gas being introduced or by forming a film from a mixture of a particular metal with an inorganic compound such as a metal oxide or sulfide.

When vacuum film-forming techniques are to be used, the light-heat conversion layer 19 to be used in the invention may be formed of Sn, Bi, Te, Sb and other metals having low heat conductivity or alloys thereof. In order to lower the reflectance of these metals, it is preferred to have the layer of a chalcogen compound with a different refractive index superposed on the light entrance side of the conversion layer 19. Mixing inorganic compounds such as chalcogen compounds with the films of the above-mentioned metals is particularly effective since not only the reflectance but also the heat conductivity of the metal film can be lowered.

Exemplary materials having these effects include sulfides such as SnS, InS and GeS, and oxides of metals such as In, Sn, Te and Ga. A suitable material may be selected from among these candidates in consideration of the heat resistance (as characterized by melting point and decomposition temperature) that is required for the light-heat conversion layer 19.

Superposed layers of these metals and inorganic compounds may be formed by evaporating or sputtering a premix of the two materials. In another method, both materials are charged into a vacuum chamber and energy is applied by a suitable method such as resistance heating in order to mix them together on a substrate, on which a film of the two materials is deposited. The thickness of the thin film formed by these vacuum techniques is variable with the types of the metal and inorganic compound used and their mixing ratio; the total film thickness ranges from 0.01 μm to 0.5 μm, preferably from 0.03 μm to 0.1 μm. The mixing ratio of the two materials also varies with their types but the weight ratio of metal to inorganic compound generally ranges from 5:1 to 1:3, preferably from 2:1 to 1:2.

When fine metal particles dispersed in a binder are to be used as a light absorber, they are typically dispersed in solution together with a binder. In another case, a photographic emulsion using a silver halide may be exposed and developed to produce a darkened metal film. Another applicable method that is known to the skilled artisan is that an organometallic compound such as silver behenate is heated in solution or film in the presence of a reducing agent so that fine metal particles are precipitated in-situ.

Pigments and dyes for use as light absorbers are generally low in film strength, namely, cohesive force; therefore, the light-heat conversion layer 19 must contain a binder in a peel/transfer process. Binders that may be used for this purpose include: homo- and copolymers of acrylic monomers such as acrylic acid, methacrylic acid, acrylic acid esters and methacrylic acid esters; cellulosic polymers such as methyl cellulose, ethyl cellulose and cellulose acetate; vinyl containing polymers and copolymers thereof such as polystyrene, vinyl chloride-vinyl acetate copolymer, polyvinyl pyrrolidone, polyvinyl butyral and polyvinyl alcohol; condensed polymers such as polyesters and polyamides; and rubber-based polymers such as butadiene-styrene copolymers. In addition to these thermoplastic polymers, polymers produced by polymerizing or crosslinking photopolymerizable or thermopolymerizable compounds such as acrylic acid esters and epoxy compounds may also be used as binders.

In the recording method contemplated by the invention, the light-heat conversion layer 19 will be heated to an extremely high temperature if it is illuminated with light of high-density energy. If ablation occurs in the light-heat conversion layer 19 on account of its deterioration, melting or other changes due to temperature elevation, part of the layer 19 is transferred to the image-receiving material during peel/transfer and color mixing, or mixing with the color of the colorant layer, can occur. To avoid this problem, the temperature at which the material of the light-heat conversion layer 19 undergoes a thermal change is preferably higher than that of the heat-release layer to be described later in this specification. The term "thermal change" means the melting and deformation or heat decomposition of the material contained in the layer of interest. When the light-heat conversion layer 19 is made of the light absorber and the binder, the heat resistance of the latter is particularly important.

The temperature for a thermal change to occur in the binder is variable with the type of the substance capable of conversion from light to heat, the amount of its use, and the temperature at which the material of the heat-release layer will undergo a thermal change; generally, polymers having a thermal decomposition temperature of at least 200° C. particularly 250° C. or more, are preferred Water-soluble polymers such as polyvinyl alcohol and alcohol-soluble polymers such as polyvinyl butyral and nylons are used with advantage since they satisfy the above-described condition for thermal decomposition temperature and because they provide not only ease in coating application and film formation but also resistance to the solvent for the heat-release layer to be superposed on the light-heat conversion layer. The ratio of the dye or pigment (substance capable of conversion from light to heat) to the binder is generally 1:5–10:1, preferably 1:3–3:1, on a weight basis. If this ratio is too small, the cohesive force of the light-heat conversion layer 19 will drop to increase the chance for the transfer and color mixing of the substance capable of conversion from light to heat. If the ratio is too high, a greater film thickness is required for achieving a given light absorbance and this increases the chance for sensitivity drop.

The thickness of the light-heat conversion layer 19 incorporating the pigment or dye described above is variable with the properties of the colorant and binder to be used; generally, the layer 19 has an average thickness of 0.05–2 µm, preferably an average thickness of 0.1–1 µm; additionally, it preferably has a light absorbance of at least 70% at the wavelength of laser light.

Speaking further of the light-heat conversion layer 19 which contains the colorant (as selected from among the pigments and dyes listed above) and the binder, the microscopic smoothness of the surface may sometimes be lost as the weight ratio of colorant to binder increases. This problem is particularly serious when pigments are used because the morphology of their particles affects the surface of the layer by creating asperities. A further increase in the pigment ratio renders the film of the light-heat conversion layer 19 porous. Hence, the film thickness of the layer 19, or its coating weight, may not be uniform throughout. However, what is important to the purposes of the invention is that the heat-release layer 20 cover substantially the whole surface of the light-heat conversion layer 19 and there will be no significant deterioration in characteristics if the microscopic film thickness of the heat-release layer 20 varies on pitches smaller than the size of image-forming pixels (which is generally at least 5 µm).

The light-heat conversion layer 19 can be provided on the support by any methods known to the skilled artisan. Stated more specifically, a suitable light absorber and binder as selected from the candidates listed above are dissolved in an organic solvent and applied by rotational coating with a whirler or a spinner, or by web coating with a gravure or doctor blade, or by dip coating or the like. If pigments are to be used, known means may be adopted, such as a ball mill, ultrasonic waves and a paint shaker. Any common solvents suitable for the binder and colorant used may be employed, as exemplified by water, alcohols, ketones and cellosolve acetates.

The heat release layer 20, which is present between the colorant layer 22 and the light-heat conversion layer 19 or the support 18 in the absence of illumination with light of high-density energy or in the absence of heat application, serves to bond the two members together. It also insures that part of the light-heat conversion layer 19 in the region illuminated with light of high-density energy is prevented from being transferred onto the image-receiving material 12, thereby causing color mixing during peel/transfer; additionally, it contributes an improvement in the recording sensitivity. Stated more specifically, the heat-release layer 20 receives the heat absorbed by the light-heat conversion layer 19 or the heat supplied from the support 18, thereby reducing either the force of its bond to the light-heat conversion layer 19 or the support 18, or the force of its bond to the colorant layer 22, or its cohesive force.

In order for the heat-release layer 20 to perform these functions, it is necessary that those changes in the binding or cohesive force should take place with a lower illumination energy than is required for the light-heat conversion layer 19 to experience a thermal change (the heat decomposition of the binder, colorant or the like). To this end, the heat release layer 20 for use in the invention is so designed that it will experience a thermal change at lower temperatures than the light-heat conversion layer 19. By doing this, not only can color mixing be prevented but also transfer is induced with lower illumination energy, thus proving effective for the purpose of high-speed recording. It should be noted that the heat-release layer 20 to be used in the invention must have a sufficient binding and cohesive force to insure that the colorant layer 22 in the region not illuminated with light of high-density energy will not be transferred onto the image-receiving material 12 during peel/transfer.

To meet the requirement mentioned above, the heat-release layer 20 for use in the invention contains polymeric materials, among which those polymers having comparatively low heat decompositions temperatures are particularly preferred. Alternatively, heat-decomposable low-molecular weight compounds may be added to common polymers so as to render them peelable under heat application.

Exemplary polymeric materials that can be used in the heat-release layer 20 include autoxidative polymers such as nitrocellulose, halogen-containing polymers such as chlorinated polyolefins, chlorinated rubbers, polyvinyl chloride and polyvinylidene chloride, acrylic polymers such as polyisobutyl methacrylate, and cellulose esters such as ethyl cellulose.

The pyrolytic reaction which occurs in the heat-release layer 20 used in the invention may involve a broad range of thermal reaction modes that are accompanied by the cleavage of bonds, as exemplified by oxidation, denitrification, decarbonation and dehalogenation. The temperature for thermal decomposition is 280° C. or less, preferably 230° C. or less, and the use of materials that permit the pyrolytic reaction to proceed exothermically is preferred. The value of thermal decomposition temperature may be determined by common procedures of measurement including DSC (differential scanning calorimetry) and thermogravimetric analysis. The thermal decomposition temperature and other values of thermal characteristics as determined by these methods generally vary somewhat depending on the rate of temperature elevation. In the examples of the invention that are to be described later in this specification, the thermal decomposition temperature of a material of interest is referenced to the temperature at which it is thermally decomposed to one half of its total amount when evaluated at a rate of 10° C./min.

Preferred examples of the heat-decomposable low-molecular weight compounds that can be added to the heat-release layer 20 for use in the invention are exothermic decomposable or gas evolving materials such as diazo and azide compounds. While common polymers may be used as binders in the heat-release layer, it is more preferred to use the above-mentioned heat-decomposable polymers as binders in combination with common polymers. In this case, the weight ratio between the heat-decomposable low-molecular weight compound and the binder polymer ranges generally from 0.02:1 to 3:1, preferably from 0.05:1 to 2:1.

When the peeling of the area illuminated with light of high-density energy during peel/transfer takes place either at the interface between the light-heat conversion layer 19 and the heat-release layer 20 or at the cohesive failure surface of the heat-release layer 20, all or part of the heat-release layer 20 in the area illuminated with light of high-density energy will be transferred onto the image-receiving layer. Therefore, if the heat-release layer 20 is heavily colored, undesirable color mixing will occur in the image on the receiving material 12. Hence, it is preferred that the heat-release layer 20 is transparent to visible light to such an extent that color mixing will not be objectionable to the eye even if the heat-release layer 20 is transferred onto the image-receiving layer. Stated specifically, the heat-release layer 20 should absorb visible light by no more than 50%, preferably by no more than 10%.

The heat-release layer 20 used in the invention must cover substantially the whole surface of the light-heat conversion layer 19. To this end, the material of the heat-release layer has to be provided over the light-heat conversion layer 19 in an amount greater than a certain value. The average thickness (coating weight) of the heat-release layer 20 ranges from 0.03 µm to 0.3 µm. If the average thickness of the heat-release layer 20 is less than 0.03 µm, not only is the recording sensitivity reduced considerably but also part of the light-heat conversion layer 19 is transferred onto the image-receiving layer to cause color mixing. If the average thickness of the heat-release layer 20 exceeds 0.3 µm, the sensitivity of high-speed recording will drop significantly.

Speaking further of the heat-release layer 20 which comprises the colorant (as selected from among the pigments and dyes listed above) and the binder, the surface will become uneven as the pigment ratio increases and a porous membrane structure will occur at even higher pigment ratios. If this is the case, the film thickness of the heat-release layer 20 coated and dried on the light-heat conversion layer 19 is highly sensitive to the film structure of the light-heat conversion layer 19. Considering this fact, the above-defined thickness of the heat-release layer 20 which is held advantageous for the purposes of the invention is expressed as a value that has been calculated by averaging microscopic variations in film thickness.

To provide the heat-release layer 20 over the light-heat conversion layer 19, any methods and solvents known to the skilled artisan may be employed as in the case of forming the light-heat conversion layer 19. If color mixing in the image area does not cause any adverse effects on quality as in the case of printing mask films, the heat-release layer may optionally be omitted.

The colorant layer 22 to be used in the invention may be selected as appropriate for the mechanism of action and the properties of the heat-release layer 20 that have been described above. Generally, colorants such as dyes and pigments for rendering the image visible are mixed with binders. Pigments or dyes are used as colorants. Pigments are generally classified as organic and inorganic types; the former type excels in the transparency of film whereas the latter type generally excels in hiding power. If the image forming system of the invention is to be used in printed color proofing, organic pigments with colors that are identical or close to yellow (Y), magenta (M), cyan (C) and black (K) which are commonly incorporated in printing inks are used with advantage. Metal powders, fluorescent pigments and other colorants may also be used in accordance with a specific object. Pigments that are used with advantage include azos, phthalocyanines, threnes (e.g. anthraquinones), dioxazines, quinacridones and isoindolinones. Pigments are typically dissolved in organic solvents of dispersed in aqueous dispersants together with organic binders.

The pigments are pulverized to particles that are fine enough to guarantee the reproduction of the desired image color and quality. Generally speaking, average particle sizes of 1 µm or less are preferred for the purpose of attaining high resolution, with the value of 0.5 µm or less being particularly preferred.

The following are a few examples of the many pigments and dyes that are known in the art but it should be understood that the pigments or dyes that can be used in the invention are by no means limited to these examples (in the following list, C.I. means "Color Index").

Victoria Pure Blue (C.I. 42593);
Auramine O (C.I. 41000);
Carotene Brilliant Flavine (C.I. Basic 13);
Rhodamine 6GCP (C.I. 45160);
Rhodamine B (C.I. 45170);
Safranine OK70:100 (C.I. 50240);
Erioglaucine X (C.I. 42080);
Fast Black HB (C.I. 26150);
No. 1201 Lionol Yellow (C.I. 21090);
Lionol Yellow GRO (C.I. 21090);
Benzidine Yellow 4T-564D (C.I. 21095);
Lionol Red 7B4401 (C.I. 15850);
Fastgen Blue-TGR-L (C.I. 74160);
Lionol Blue SM (C.I. 26150);
Mitsubishi Carbon Black MA-100; and
Mitsubishi Carbon Black #40.

Besides these pigments, one may use processed pigments manufactured and sold by Ciba-Geigy A.G., which have fine-particulate pigments dispersed in polymer carriers and these include: Microlith Yellow 4GA, Microlith Yellow 2R-A (C.I. 21108), Microlith Yellow MX-A (C.I. 21100), Microlith Blue 4G-A (C.I. 74160), Microlith Red 3R-A, Microlith Red 2C-A, Microlith Red 2B-A, Microlith Black C-A, etc.

The colorant layer 22 contains at least one binder for controlling its film-forming property, brittleness and the force of bond to the heat-release layer 20. Binders are also used for controlling the theological properties of the film described above, as well as for stabilizing the pigments in dispersion system. Typically, both the pigment and the whole or part of the binder are pulverized in a mill until a desired particle size is attained. The paste comprising the pulverized particles is diluted with a solvent or a solvent mixture to prepare a dispersion of a desired viscosity. In order to insure that the colorant layer 22 is selectively transferred in correspondence to the imagewise illuminated area and the non-illuminated area, thereby producing an image of high quality, the film of colorant layer 22 to be used in the invention is preferably low in both the shear breaking force and the elongation.

If the molecular weight of the binder polymer is unduly low, the binder tends to soften or melt when the colorant layer 22 is laminated to the image-receiving layer 16 under pressure and heat application, and the adhesion to the light-sensitive layer in the unilluminated area where bonding should not take place is increased, whereupon a drop in resolution tends to occur. Considering this fact, the binder polymer has preferably an average molecular weight of 5,000–100,000, with the range from 10,000 to 30,000 being particularly preferred.

The binder suitable for use in the colorant layer is a thermoplastic resin or a mixture of thermoplastic resins. In the case of a mixture, two or more resin components may be compatible or incompatible with each other. Specific examples of the preferred polymer include cellulosic derivatives such as methyl cellulose, ethyl cellulose and triacetyl cellulose, and homo- or copolymers of acrylic monomers such as acrylic acid, methacrylic acid, acrylate esters and methacrylate esters. Other useful examples are vinyl polymers such as polyvinyl butyral and polyvinyl formal, and styrenic polymers.

In a preferred embodiment, the pigment to binder ratio, which is variable with the specific combination of the two components, ranges generally from 1:5 to 10:1, preferably from 1:3 to 3:1, on a weight basis. In order to improve the sensitivity of laser recording, the heat-decomposable polymers listed for use as binders in the heat-release layer may be employed as binders in the image-forming layer; alternatively, those heat-decomposable polymers may be mixed or otherwise added to the binders for the colorant layer.

The thus formed colorant layer 22 is characterized by the brittleness of both the pigment and the binder and performs satisfactorily for the purpose of producing a monochromatic image of high quality. However, if an image already formed on the image-receiving layer is to be overlaid with an image of another color, followed by transfer and bonding to produce a multicolor image, intense pressure and heat must be applied but this adds to the complexity and cost of the recording apparatus. To avoid this problem, one may add plasticizers to the colorant layer 22 so that the bonding property of the film and its cohesive force can be controlled.

Plasticizers are added so that the bond between adjacent colorant layers 22 of different colors is sufficiently increased to promote their effective transfer onto the image-receiving material 12. The material for use as the plasticizers is selected as appropriate for the specific combination of colorants and binders. Low-molecular weight plasticizers are exemplified by, but not limited to: phthalate esters such as dibutyl phthalate (DBP), di-n-octyl phthalate (DnOP), di(2-ethylhexyl) phthalate (DOP), dinonyl phthalate (DNP), dilauryl phthalate (DLP), butyllauryl phthalate (BLP) and butylbenzyl phthalate (BBP); aliphatic dibasic acid esters such as di(2-ethylhexyl) adipate (DOA) and di(2-ethylhexyl) sebacate (DOS); phosphate triesters such as tricresyl phosphate (TCP) and tri(2-ethylhexyl) phosphate (TOP); polyol esters such as polyethylene glycol ester; and epoxy compounds such as epoxy aliphatic acid esters.

Besides these common plasticizers, acrylate esters such as polyethylene glycol dimethacrylate, 1,2,4-butanetriol trimethacrylate, trimethylolethane triacrylate, pentaerythritol triacrylate, pentaerythritol tetraacrylate and dipentaerythritol polyacrylate may also be used with advantage depending on the specific type of the binder used.

These plasticizers may be used either alone or in admixtures. If desired, secondary plasticizers (auxiliary plasticizers) may be incorporated together with these plasticizers.

The amount of plasticizers to be added varies with the specific combination of the pigment and the binder but, generally, the weight ratio of the sum of the pigment and the binder to the plasticizer ranges from 100:1 to 1:2, with the range of 100:2 to 1:1 being preferred.

Besides the components described above, the colorant layer 22 may incorporate surfactants, thickeners, dispersion stabilizers, adhesion promoters and other additives. The dry film thickness of the colorant layer 22 depends on the intended use of the image forming system of the invention but it will not generally exceed 5 μm if the specific purpose is to form high-quality image by accomplishing satisfactory peel/transfer. Preferably, the dry film thickness of the colorant layer 22 is in the range from 0.1 μm to 2 μm, with the range 0.1–1 μm being more preferred.

Although not shown, a cover film may optionally be provided on the surface of the colorant layer 22 in order to prevent such troubles as damaging of the layer during handling or the bonding of film surfaces during storage. The cover film provided for these purposes may generally be formed of high-molecular weight compounds including polyethylene terephthalates, polycarbonates, polyethylenes and polypropylenes. The thickness of the cover film ranges generally from 5 to 400 μm, preferably from 10 to 100 μm. The surface of the cover film on the side in contact with the colorant film 22 may be subjected to various surface treatments for controlling the bond property of the cover film.

The film thicknesses of the light-heat conversion layer 19, the heat-release layer 20, the colorant layer 22 and other layers to be used in the invention can be measured not only by the common tracer method but also by other techniques including examination under microscopes such as a scanning electron microscope, a tunnel microscope and a laser microscope, physical surface analyses such as ESCA and FT-IR, and chemical analysis of the respective layers after dissolution in solvents.

As already mentioned, if the light-heat conversion layer 19 comprises a dispersion of fine-particulate materials such as carbon black, the surface of this layer may sometimes become uneven under the influence of the morphology of the dispersed particles. If the light-heat conversion layer 19 having this uneven surface is overlaid with the heat-release layer 20 or even with the colorant layer 22, the thickness of the overlying layer or layers will not necessarily be uniform under the influence of the asperities in the underlying layer. In the examples of the invention to be described later in this specification, the average film thickness of the light-heat conversion layer 19 on the colorant sheet 10 and that of the colorant layer 22 were measured by profile examination with a scanning electron microscope. Additionally, a coating solution having the same formulation as the coating solution used to prepare the colorant sheet 10 was applied onto a smooth-surfaced polyester film under the same conditions as for the preparation of the colorant sheet 10 and subsequently dried; when the thicknesses of the two film samples were measured with a tracer gage meter, the results were substantially identical. Hence, the measured gage of a layer formed on the smooth-surfaced polyester film was used as the average thickness (coating weight) of each of the corresponding layers in the colorant sheet 10.

Normally, the thus composed colorant sheet 10 has the heat release layer 20 bonded strongly to the colorant layer 22. However, if it is heated directly by thermal recording means such as a thermal head or laser or indirectly by the heat generated as a result of light-to-heat conversion in the light-heat conversion layer 19, a thermal reaction such as a pyrolytic reaction occurs in the heated area of the heat release layer 20 and the force of bonding between the colorant layer 22 and the light-heat conversion layer 19 or the support 18 is reduced so much that only the heated area of the colorant layer 22 will become easily peelable.

Thus, the most characteristic portion of the colorant sheet 10 to be used in the invention is that during transfer, or image formation, the colorant layer 22 will experience no change but that the heat release layer 20 which reduces the bond of the colorant layer 22 is provided under the colorant layer 22. Because the colorant sheet 10 has this heat release layer 20, the thickness of the colorant layer 22 can be reduced significantly to only about a tenth of the thickness that has been required in the conventional melt and sublimation thermal transfer processes. Improvement is also possible in resolution and particularly great with the use of a laser head; typical data that can be cited are improvements by factors of about 2–13 (300–600 dpi with the use of a thermal head, and 1000–4000 dpi with the use of a laser head). This means that even if the spot size of a laser beam is 10 μm or below, satisfactory image reproduction is possible since the thickness of the colorant layer 22 will in no way exceed 5 μm and typically in the range from 0.1 to 2 μm.

It should be noted that when recording image with a thermal head, the light-heat conversion layer is not necessary and may be omitted. The heat-release layer is advantageous for several purposes such as providing increased sensitivity but, depending on the use, this layer may be eliminated for cost or other reasons.

The image-receiving material 12 comprises a support 26, a cushion layer 28 formed on the support 26, and an image-receiving layer 16 formed on the cushion layer 28. If the image-receiving layer also serves as the cushion layer, the cushion layer 28 may be omitted from the image-receiving material 12 although this case is not shown; another design of the image-receiving material 12 that can be adopted as required is such that the support 26 also serves as the image-receiving layer 16. The support 26 is not limited in any particular way as long as it is in the form of a film or a plate and it may be made from any materials. Exemplary materials for the support 26 generally include high-molecular weight compounds such as polyethylene terephthalates, polycarbonates, polyethylenes, polyvinyl chloride, polyvinylidene chloride, polystyrenes, styreneacrylonitrile copolymers, etc. A biaxially drawn polyethylene terephthalate is particularly preferred since it has adequate dimensional stability in the presence of water or heat. The thickness of the support 26, if it is a film, ranges generally from 10 to 400 μm, preferably from 25 to 200 μm. Depending on the use, glass, metal plates and other materials can be used as the support 26.

Although not shown, the surface of the support 26 may be provided with an undercoat or subjected to a physical surface treatment in order to provide better adhesion to the cushion layer 28 or the image-receiving layer 16. The undercoat may be formed of a suitable material that is selected from among film-forming polymer materials in consideration of such factors as the adhesion to both the support and the image-receiving layer. While the thickness of the undercoat is not limited to any particular value, the range from 0.01 μm to 2 μm is usually preferred. Physical treatments such as glow discharge and corona discharge on the surface of the support 26 are particularly preferred as means of increasing the adhesion to the cushion layer 28 or image-receiving layer 16.

The cushion layer 28 has sufficient elasticity to absorb the force that is exerted when the colorant sheet 10 and the image-receiving material 12 are pressed against each other during transfer while enabling sufficiently intimate contact between the colorant layer 22 and the image-receiving layer 16 to confine any dust or dirt that may be present at the interface between these layers. The cushion layer 28 having this capability is preferably made of a polymer that has a Vicat softening point below about 80° C. Examples of such polymer include ethylene-vinyl acetate copolymers, vinyl chloride-vinyl acetate copolymers, acrylate ester-ethylene copolymers, etc. Materials are also useful that have plasticizers added to polymers other than those listed above. Examples of this case are systems that consist of resins such as polystyrenes, polymethacrylate esters and polyvinyl acetals in combination with known plasticizers such as phosphate esters, phthalate esters, aliphatic dibasic acid esters and epoxidized esters. The weight ratio of resin to binder depends on the materials used and it generally ranges from 1:0.1 to 1:40, preferably from 1:0.5 to 1:5.

The film thickness of the cushion layer depends on the degree of its elasticity and it generally ranges from 3 to 100 μm, preferably from 7 to 50 μm.

The image-receiving layer 16 serves to receive the colorant layer 22 that has been heated imagewise and it is generally formed of a polymeric material as the chief component. While the polymer that can be used in the image-receiving layer is not substantially limited to any particular types, it is generally required to have suitable degrees of compatibility and wetting property with the colorant layer. To meet this need, a suitable polymer is selected in accordance with the components of the colorant layer from among materials having various physical properties such as glass transition temperature (Tg) and solubility parameter (SP). Take, for example, the case where polyvinyl butyral is used as a binder in the colorant layer; the polymer in the image-receiving layer may be a resin selected from among polyvinyl butyral, low-softening point polyesters, etc. Besides these polymers, the image-receiving layer may optionally contain not only the plasticizers described above but also surfactants and other suitable additives. The thickness of the image-receiving layer, if combined with the above-described cushion layer, is generally in the range from 0.2 to 30 μm, preferably from 1 to 5 μm. It should, however, be noted that the combined thickness of the image-receiving layer depends on the materials used and the specific use and is not limited in any particular way.

Although not shown in FIG. 3, the invention embraces the case where the image-receiving layer 16 also serves as a cushion layer. To insure an appropriate degree of release property for enabling transfer onto the final printing paper as required, the image-receiving layer in that embodiment is preferably made of the photopolymerizable materials described in Unexamined Published Japanese Patent Application (kokai) Sho 59-97140.

The photopolymerizable image-receiving layer 16 suitable for that purpose comprises:

a) at least one polyfunctional vinyl or vinylidene compound capable of forming a photopolymer by addition polymerization;

b) an organic polymeric binder;

c) a photopolymerization initiator; and an optional additive such as a thermal polymerization inhibitor.

Exemplary vinyl or vinylidene compounds suitable for use in the invention include unsaturated esters of polyols, in particular, esters with acrylic or methacrylic acid, as exemplified by ethylene glycol diacrylate, glycerin triacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,3-pentanediol dimethacrylate, bisacrylate or bismethacrylate of polyethylene glycol having a molecular weight of 200–400 and analogs thereof; unsaturated amides, in particular, those of α,ω-diamine having acrylic or methacrylic acid that may have the alkylene chain opened by carbon atoms, as well as ethylenebismethacrylamide.

Additionally, esters of polyols with polyfunctional organic acids may be condensed with acrylic or methacrylic acid to produce polyester acrylates and these may also be used. It should, however, be noted that these are not the sole cases of the invention. The organic polymeric binder (b) is a thermoplastic resin or a mixture of thermoplastic resins and may be exemplified by: homo- or copolymers of acrylic monomers such as acrylic acid, methacrylic acid, acrylate esters and methacrylate esters; cellulosic polymers such as methyl cellulose, ethyl cellulose and cellulose acetate; vinyl polymers or copolymers such as polystyrenes, polyvinyl pyrrolidone, polyvinyl butyral and polyvinyl alcohol; condensed polymers such as polyesters and polyamides; and rubber polymers such as butadiene-styrene copolymers. Among these, polymers of acrylic monomers are preferred because of the ease with which thermal properties such as softening point can be controlled over a wide range and because they are highly compatible with photopolymerizable monomers. The polymers listed above have average molecular weights of 10,000–2,000,000. The mixing ratio between the photopolymerizable monomer and the organic polymeric binder varies with the specific combination of the monomer compound and the binder to be used but, generally speaking, the preferred monomer to binder ratio ranges from 0.1:1.0 to 2.0:1.0 on a weight basis.

The photopolymerization initiator must be a compound that has absorption and activity in the near-ultraviolet range but which has little or no absorption in the visible range. Examples of such compound include: aromatic ketones such as benzophenone, Michler's ketone [4,4'-bis(dimethylamino)benzophenone], 4,4'-bis(dimethylamino)benzophenone, 4-methoxy-4'-dimethylaminobenzophenone, 2-ethylanthraquinone, phenanthraquinone and other aromatic ketones; benzoin ethers such as benzoin, benzoinmethyl ether, benzoinethyl ether and benzoinphenyl ether; benzoins such as methyl benzoin and ethyl benzoin; as well as 2-(O-chlorophenyl)-4,5-diphenylimidazole dimer and 2-(O-chlorophenyl)-4,5-(m-methoxyphenyl)imidazole dimer.

The appropriate mixing ratio between the photopolymerizable monomer and the organic polymeric binder varies with the specific combination of the monomer compound and the binder used but, generally speaking, the preferred monomer to binder ratio ranges from 0.1:1.0 to 2.0:1.0 on a weight basis. The photopolymerization initiator is preferably added in an amount of 0.01–20 wt % of the monomer compound.

Before being brought into a superposed relationship with the colorant sheet 10 (see FIG. 3a), the image-receiving material 12 may optionally have the image-receiving layer 16 covered with a protective sheet 17, which is preferably peeled off and discarded just before the image-receiving material 12 is placed in a superposed relationship with the colorant sheet 10.

The image-receiving layer 16 in the image-receiving material 12 has tackiness. Hence, the heated area of the colorant layer 22 will, upon contact with the image-receiving layer 16, be readily peeled off and transferred onto the latter. The image-receiving layer 16 is also peelable and, hence, if this layer and the final receiving sheet 14 are brought into intimate contact and a superposed relationship, compressed together under heating and separated from each other, the image-receiving layer 16 will be peeled from the cushion layer 28 and transferred onto the final receiving sheet 14. An example of the process of producing a color proof by laser head recording in a heating mode (i.e., by thermal printing) will now be described with reference to FIG. 3 which shows the successive image recording steps.

The image recording process shown in FIG. 3 starts with transporting the colorant sheet 10 over the image-receiving material 12 in such a way that the colorant layer 22 faces the image-receiving layer 16 (see FIG. 3a); then, the protective sheet 17 is peeled from the image-receiving material 12 and both the colorant sheet 10 and the image-receiving material 12 are brought into a superposed relationship (FIG. 3b). In this case, pressure and heat may be applied by laminating means such as heated rollers so that the colorant layer 22 and the image-receiving layer 16 are bonded under a uniform adhesive force and this is preferred for the purpose of producing an image of uniform thickness.

Then, a laser head 24 with a laser 24a emits laser light which passes through an imaging lens 24b to be focused in a smaller beam spot. The colorant sheet 10 is subjected to imagewise exposure by the laser beam in a heating mode from the transparent support 18, whereupon the laser light is converted to heat by the light-heat conversion layer 19 in the colorant sheet 10 and the resulting heat is conducted to the heat release layer 20, whereby a latent image is recorded (FIG. 3c). Image recording may be performed by imagewise heating by other suitable thermal recording means such as a thermal head. As a result of this image recording step, the bonding force of the colorant layer 22 provided by the heat release layer 20 in the heated area decreases sufficiently to render the colorant layer 22 readily separable from the light-heat conversion layer 19. Shown by 23 in FIG. 3c is the area of the heat release layer 20 that has become low in bonding force as a result of heating.

It should be noted here that the colorant sheet 10 and the image-receiving material 12 may be brought into a superposed relationship (to have the colorant layer 22 adhere to the image-receiving layer 16) by the laminating means solely in the position where image recording is to be done (i.e., the area that is to be irradiated with light of high-density energy such as laser light or that is to be heated under pressure with the thermal head 24) or, alternatively, lamination may be performed across the entire surfaces of the two members.

Subsequently, the image-receiving material 12 is peeled from the colorant sheet 10 for transfer (FIG. 3d). As mentioned in the previous paragraph, the heated area of the colorant layer 22 in the colorant sheet 10 has become low in the force of bonding to the light-heat conversion layer 19 compared with the force of its adhesion to the image-receiving layer 16 and, hence, that area is readily peelable from the light-heat conversion layer 19. The image-receiving layer 16 is so tacky that if the image-receiving material 12 is peeled from the colorant sheet 10 with pressure being applied by a pressing means such as peel rollers, the non-heated area of the colorant layer 22 is peeled from the image-receiving layer 16 without causing unevenness while, at the same time, the heated area of the colorant layer 22 is transferred onto the image-receiving layer 16, thereby forming an image on the latter. Since the colorant layer 22 is comparatively thin (typically 0.1–2 μm and at no times greater than 5 μm), the peel/transfer process can be accomplished in an accurate and positive manner, thereby assuring the formation of high-quality images without uneven peel and failure in registration.

When image formation on the image-receiving layer 16 in the image-receiving material 12 is complete for the first color, a colorant sheet for a second color is used and the process of the steps shown in FIGS. 3a–3d is repeated to form an image of the second color on the image-receiving material 12 by peel and transfer.

Thus, the images of four colors C, M, Y and K (or three colors C, M and Y, with optional colors that are commonly referred to as "special colors" in the printing area) are produced and transferred onto the image-receiving material 12 (or image-receiving layer 16), thereby forming a full color image. After image formation ends for all colors of interest, the final receiving sheet 14 and the image-receiving material 12 (image-receiving layer 16) are brought into a superposed relationship (laminated) and compressed under heating (FIG. 3e) and, then, the final receiving sheet 14 is peeled from the image-receiving material 12 (FIG. 3f).

As already mentioned, the image-receiving layer 16 in the image-receiving material 12 is peelable. Additionally, the surface of the image-receiving layer 16 is tacky before it cures. Hence, if the image-receiving layer 16, after being adhered to the final receiving sheet 14, is cured (by illumination with a uv radiation if it is uv curable) and peeled, it will separate from the cushion layer 28 but remain adhering to the final receiving sheet 14, whereby the desired color image is transferred onto the latter.

In the process under discussion, the colorant sheet 10 is superposed on the image-receiving material 12 before the recording step; if necessary, the colorant sheet 10 may be superposed on the image-receiving material 12 after the recording step.

The color image forming method described above with reference to FIG. 3 is implemented by the color image forming apparatus of the invention, which is shown conceptually in FIG. 2. The color image forming apparatus generally indicated by 30 in FIG. 2 is adapted for producing full color images and comprises a light-sensitive material supply unit 32, an image forming drum 34, a light-sensitive material mount/dismount mechanism 36, a lamination mechanism 38 provided on the circumference of the drum 34, an exposing head 40, a peel mechanism 42, a paper feed unit 44, a lamination unit 46, a fixing unit 48, a peel unit 50, a tray unit 52 and a control unit 51.

Processing with the color image forming apparatus 30 starts with feeding the image receiving material 12 and the colorant sheet 10 from the light-sensitive material supply unit 32 onto the drum 34. The supplied image-receiving material 12 is mounted on the drum 34 by the mount/dismount mechanism 36 and passed through the lamination mechanism 38 which applies a predetermined pressure and heat so that the colorant sheet 10 will adhere to it in a superposed relationship (see FIGS. 3a and 3b). Then, the exposing head 40 which is controlled by the control unit 51 in accordance with an image signal performs imagewise laser exposure in a heating mode to record a latent image (see FIG. 3c). Subsequently, the peel mechanism 42 peels the colorant sheet 10 from the image-receiving material 12 mounted on the drum 34, so that the latent image on the colorant sheet 10 is transferred onto the image-receiving material 12, thereby forming a visible image on the image-receiving material 12 (see FIG. 3d). The process of these steps (in FIGS. 3a–3d) is repeated for 3–4 colors to form a full color image on the image-receiving material 12 (see FIG. 3e). Thereafter, the image-receiving material 12 and the final receiving sheet 14 as supplied from the paper feed unit 44 are passed through the lamination unit 46 so that the two members are placed in a superposed and intimate contact relationship, thence passed through the fixing unit 48 so that the image-receiving layer 16 in the image-receiving material 12 is photocured and separated from the other part of the image-receiving material 12 in the peel unit 50 (see FIG. 3f). The final receiving sheet 14 now carrying the full color image is ejected onto a proof tray 52a whereas the used image-receiving material 12 is ejected into a scrap stacker 52b. Thus, the full color image can be obtained as a hard copy.

The light-sensitive material supply unit 32 consists of the following sections: a light-sensitive material station 53 which accommodates rolls of image-receiving material 12 and a plurality of colorant sheets 10 such as rolls of heat-sensitive materials including standard donor sheets for Y, M, C and K, as well as special color sheets used in the printing area (said rolls of heat-sensitive materials are hereunder referred to simply as "light-sensitive materials"); a pair of withdrawing rolls 54 for withdrawing one light-sensitive material; a cutter 55 with which the light-sensitive material that has been withdrawn in a specified length from the light-sensitive material station 53 by means of the withdrawing rolls 54 is cut to a sheet form; a pair of rollers 56 between which the sheet of light-sensitive material is held for transport; and a guide 57 that directs the sheet of light-sensitive material onto the drum 34 so that its front end is led to the mount position in the light-sensitive material mount/dismount mechanism on the drum 34.

The image forming drum 34 is first supplied with the sheet of image-receiving material 12 (which is hereunder referred to as the "image-receiving sheet"). The front end of the image-receiving sheet is secured to the light-sensitive material mount/dismount mechanism 36 by a suitable means such as a clamp. As the drum rotates in the direction of arrow, the image-receiving sheet 12 is wound onto the drum 34, with its rear end being also secured by the mechanism 36. In a preferred embodiment, either the front end securing portion of the mechanism 36 or its rear end securing portion or both are adapted to be movable on the outer circumference of the drum 34 so that varying lengths of the light-sensitive sheet can be secured to the drum 34.

After the image-receiving sheet 12 is wound onto the drum 34, the colorant sheet 10 is transported from the supply unit 32 in entirely the same manner and wound in superposition on the image-receiving sheet 12. The colorant sheet 10 is superposed on the image-receiving sheet 12 by means of the laminating mechanism 38 which comprises a laminating roller 58 containing a built-in heater (not shown), an arm 59 that causes the laminating roller 58 to pivot about a fulcrum 59a so that it approaches or departs from the outer circumference of the drum 34, and pressing means 60 that presses the laminating roller 58 against the outer circumference of the drum 34 with a specified force. The pressing means 60 may be urging means such as a spring or, alternatively, it may be an air-cylinder manipulator. The image-receiving layer 16 which is on the outermost surface of the image-receiving sheet 12 is sticky, so lamination can be achieved by winding the colorant sheet 10 onto the image-receiving sheet 12 with the specified force of pressure being exerted by the laminating roller 58; hence, the image-receiving layer 16 in the image-receiving sheet 12 can be bonded to the colorant layer 22 in the colorant sheet 10 not only in the absence of wrinkles or other defects in the colorant sheet 10 but also under a uniform adhesive force.

To insure uniform and strong bonding in the case described above, the colorant sheet 10 is laminated onto the image-receiving sheet 12 by means of the laminating pressure roller 58. If a greater adhesive force is desired, it is also preferred to perform lamination with the laminating roller 58 being heated as it applies pressure. Considering the mechanical properties, such as thermal expansion coefficient, of the respective sheets and in view of limitations such as effects on the spot of an exposing laser beam, the temperature for heating the roller 58 is typically 130° C. or less, preferably 100° C. or less. In the illustrated case, the colorant sheet 10 is pressed into a superposed relationship with the image-receiving sheet 12 by means of the laminating roller 58 but this is not the sole case of the invention and any device that is capable of lamination under pressure may be employed, as exemplified by a pressure-urging member in a rod form with a smooth front end.

To wind the image-receiving sheet 12 onto the drum 34, the following method is preferably adopted; the front end of the image-receiving sheet 12 is secured onto the drum 34 by the light-sensitive material mount/dismount mechanism 36 and the other parts of the image-receiving sheet 12 are held by the transport roller pair 56, the laminating roller 58 or some other means and wound onto the drum 34 under a specified tension that is applied to the image-receiving sheet 12. If desired, piercing holes may be provided in the outer circumference of the drum 34 so that the image-receiving sheet 12 can be sucked onto the drum 34 by suction means. The suction means is preferably used in combination with the light-sensitive material mount/dismount mechanism 36 but satisfactory results can be attained even if only one of them is used. In either case, the image-receiving sheet 12 can be secured onto the drum 34 without developing wrinkles or other defects and without causing any displacement. Tension is also preferably applied to the colorant sheet 10 as it is laminated over the image-receiving sheet 12. As in the case of winding the image-receiving sheet 12 around the drum 34, the light-sensitive material mount/dismount mechanism 36 may be employed to secure the front and/or back end of the colorant sheet 10; alternatively, the above-mentioned suction means may be used in combination with the mechanism 36. The tension to be applied to the colorant sheet 10 during lamination is preferably set at a smaller value than the tension that is applied to the image-receiving sheet 12 during its winding onto the drum 34.

The exposing head 40 comprises the laser head 24 and sub-scanning means 61 that performs sub-scanning as it moves parallel to the axis of the drum 34 (in a direction normal to the paper). The laser head 24 comprises basically the laser light source 24a that includes modulation means and which emits light of high-density energy such as a laser beam and the imaging lens 24b for adjusting the spot size of the laser beam (see FIG. 3c). The colorant sheet 10 is subjected to main scanning with laser light as the drum 34 rotates. In place of the sub-scanning means 61 in the exposing head 40, the drum 34 may be furnished with axially moving means so that it is moved in the axial direction for sub-scanning while it rotationally performs main scanning.

The laser light source may be of any type that is capable of emitting light of sufficiently high-density energy to enable exposure in a heating mode and examples include gas lasers such as an argon ion laser, a helium neon laser and a helium-cadmium laser, solid-state lasers such as YAG laser and semiconductor lasers, as well as dye lasers and excimer lasers. The laser light that can be used to record images in the present invention may be the light that is directly issued from these lasers or, alternatively, the thus emitted light may be passed through a second harmonic generating device so that its wavelength is halved. A suitable laser light source is selected from among those lasers in consideration of the wavelength at which the colorant sheet 10 is sensitive to laser light, its sensitivity and the required recording speed; semiconductor lasers are the most preferred from the viewpoint of various factors such as cost, output power, size and the ease of modulation.

Modulation of laser light in response to an image signal can be performed by any known techniques; in the case of an argon ion laser, this can be effected by passing the laser beam through an external modulator and in the case of a semiconductor laser, the electric current to be injected into the laser may be controlled by a signal (for direct modulation). The spot size of the laser light to be converged on the light-heat conversion layer and the scan speed are set in accordance with various factors such as the resolution required by images and the recording sensitivity of the materials used. For printing applications, high resolutions are generally required and the smaller beam spot is preferred from the viewpoint of image quality but, on the other hand, the depth of focus will decrease to cause difficulty in mechanical control. If the scan speed is too small, the heat loss due to heat conduction to the support of the colorant sheet and the like will increase to lower the energy efficiency; in addition, the recording time is extended. Considering these facts, the following recording conditions may be adopted in the invention: the beam spot size on the light-heat conversion layer is 5–50 μm, preferably 6–30 μm; and the scan speed is at least 1 m/sec, preferably at least 3 m/sec.

Image signals are supplied from external image readers, image processors, workstations (W/S) having the DTP capability, electronic publishing systems and various kinds of memory media (e.g. magnetic tapes, floppy disks, hard disks and RAM cards) and particularly in the image forming system according to the second embodiment of the invention, matching of the color space and the like is performed by a suitable means such as the color management system (color image reproducing system) which will be described later in this specification; thereafter, the image signals are interfaced by SCSI and the like to be transmitted to the control unit 51, where they are subjected to the necessary processing and thence transmitted to the exposing head 40 to perform control over the exposure by the laser head 24 in a heating mode. The control unit 51 controls not only the sub-scanning of the exposing head 40 by the auxiliary scanning means 61 and the rotational main scanning by the drum 34, it also controls the various parts of the color image forming apparatus 30 of the invention and the overall sequence of the steps taken by the apparatus.

The peeling mechanism 42 performs the following function. The colorant sheet 10 that has a latent image formed upon exposure to the exposing head 40 in a heating mode is peeled from the image-receiving sheet 12 by this mechanism 42 while, at the same time, the latent image on the colorant sheet 10 is developed as it is peeled by this mechanism and transferred onto the image-receiving sheet 12. The peeling mechanism 42 comprises a peel roller 62, two segmented rollers 63 and 64 that contact the peel roller 62, comb-toothed guide plates 65 each of which is provided between segments of the rollers 63 and 64 along the peel roller 62, and a bracket (not shown) in which these parts are mounted as a unitary assembly. The peel roller 62 is axially supported by an arm 67 and pivots about a fulcrum 67a so that it can approach or depart from the drum 36. The peel roller 62 is also provided, via the arm 67, with pressing means 68 for pressing the laminate of the image-receiving sheet 12 and the colorant sheet 10 as it is carried on the drum 34.

The colorant sheet 10 which has a latent image formed thereon in response to the decrease in the bonding force of the colorant layer 22 as a result of the imagewise application of thermal energy due to exposure in a heating mode forms a laminate with the image-receiving material 12 having the image-receiving layer 16 which has the colorant sheet 10 bonded thereto. When the arm 67 pivots about the fulcrum 67a so that the bracket approaches the laminate and the comb-toothed guide plates 65 are inserted between the image-receiving layer 16 in the image-receiving material 12 and the colorant layer 22 in the colorant sheet 10; at the same time, the laminate is compressed with the peel roller 62 which is pressed against the colorant sheet 10. If the joining length of either one of the colorant sheet 10 and the image-receiving sheet 12 is made different from that of the other, the comb-toothed guide plates 65 can be easily inserted between the two sheets. Thereafter, the drum 34 is rotated while, at the same time, the peel roller 62, segmented rollers 63 and 64 are also rotated so that the leading end of the colorant sheet 10 is moved along the comb-toothed guide plates 65 to be held between the peel roller 62 and each of the segmented rollers 63. Thus, the colorant sheet 10 is compressed with the peel roller 62 as it is held for transport between the peel roller 62 and each of the segmented rollers 63 and 64, whereby it is peeled from the image-receiving sheet 12. Thus, the colorant sheet 10 can be peeled at a constant speed in the area where it is compressed with the peel roller 62; as a result, the peeling force can be maintained at a constant level and neither vibrations such as "stick slip" nor uneven peel will occur. As a further advantage, the peeling force that is exerted upon the image-receiving material 12 will not vary during the peeling operation and, hence, there will be no offset in the position where the image-receiving material 12 is secured onto the drum 34, nor will there be the possibility of lower precision in registration. Thus, one can produce a monochromatic halftone image that is high in quality, resolution and contrast and which yet is free from defects such as uneven peel and failure in registration.

After the peel/transfer process with exact registration achieved among the images of four colors C, M, Y and K, the image-receiving sheet 12 as guided by guide members 70 is transported by a transport roller pair 71 to the laminating unit 46. In the laminating unit 46, a receiving sheet feed roll 72 delivers the final receiving sheet 14 from a cassette 73 in synchronism with the transport of the image-receiving sheet 12 and the delivered receiving sheet 14 is guided by the guide members 70 so that it is transported toward the left in FIG. 2. If necessary, the receiving sheet 14 may be supplied to the roll 72 via a hand feed inlet 44a.

Subsequently, the image-receiving sheet 12 and the final receiving sheet 14 are laminated with registration being achieved by a register roller pair 75, then transported to the fixing unit 48. In the fixing unit 48, the image-receiving material 12 and the final receiving sheet 14 which have been laminated in the laminating unit 46 are thermally fixed with and transported through a thermal fixing roller pair 76 composed of a pressure roller 76a and a heating roller 76b. The two members are subsequently irradiated with post-exposure lamps 77 such as uv lamps, whereupon the image-receiving layer 16 in the image-receiving sheet 12 hardens to become readily peelable in the subsequent step.

In the peeling unit 50, the image-receiving layer 16 which has hardened to become easily peelable is separated from the image-receiving sheet 12 by means of a peel roller pair 78 and a peeling guide 79 while, at the same time, the image-receiving layer 16 is attached to the final receiving sheet 14 so that the image is transferred thereto. The final receiving sheet 14 carrying the transferred image is ejected as a hard copy onto the tray unit 52, in particular, the proof tray 52a, whereas the image-receiving sheet 12 which has been stripped of the image-receiving layer 16 is discarded into the scrap tray 52b.

In the example described above, the image-receiving material (or sheet) 12 is so designed that only the image-receiving layer 16 is peelable. However, this is not the sole case of the invention and another embodiment may be contemplated, in which the image-receiving layer 16 and the cushion layer 28 are rendered to be peelable simultaneously. Thus, the present invention encompasses various embodiments as long as the image-receiving layer 16 is peelable from the support 26.

In the alternative design where the image-receiving layer 16 and the cushion layer 28 (or another intermediate layer) are rendered to be peelable simultaneously, the cushion layer 28 may be formed of a transparent material in order to insure that after both the image-receiving layer 16 and the cushion layer 28 have been transferred onto the final receiving sheet 14, the cushion layer 28 can be used as an image protective sheet. The cushion layer 28 may also serve as the support of a hard copy and, in this case, the final receiving sheet 14 may comprise a transparent sheet that will serve as an image protective sheet.

The color image forming apparatus 30 described on the foregoing pages uses exposing laser head 40 as means for performing thermal energy applied recording but this may be replaced by a thermal head that performs thermal recording onto the colorant sheet 10. In a specific embodiment of this alternative case, a thermal head having a plurality of heating elements that extend along the axis of the drum 34 (in the main scanning direction) may be incorporated in the color image forming apparatus 30 shown in FIG. 2 and the drum 34 is rotated to perform auxiliary for image recording.

Figure 4:
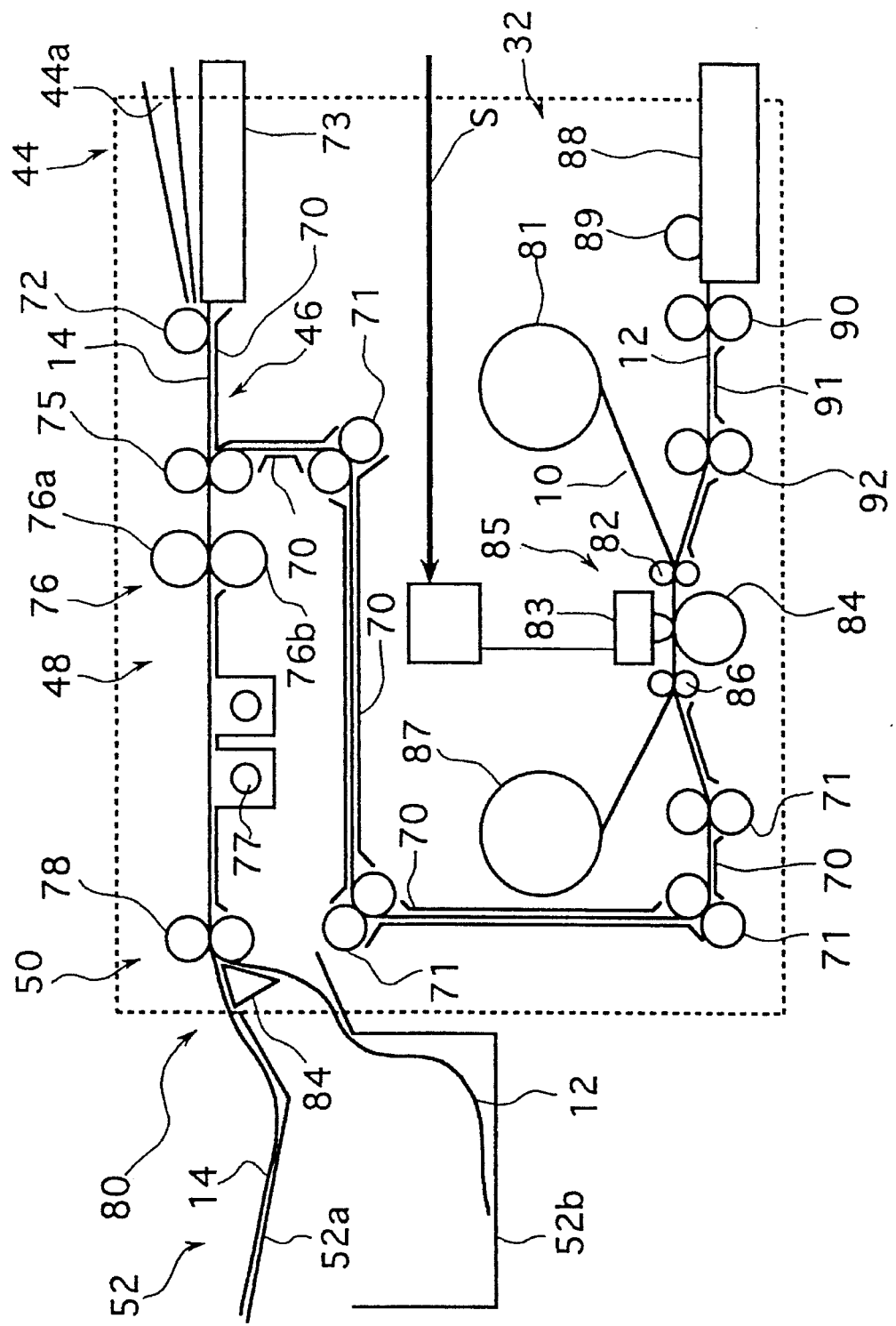
FIG. 4 is a diagrammatic section showing another embodiment of the color image forming apparatus that may be incorporated in the image forming system of the invention.

FIG. 4 shows schematically another embodiment of the color image forming apparatus of the invention, in which a thermal head is used to perform thermal recording. In the color image forming apparatus generally indicated by 80 in FIG. 4, the colorant sheet 10 is a so-called "parallel-striped" colorant sheet, that is, a different-color-striped colorant sheet comprising a web-like strip of support 18 on which colorant layers 22 of respective colors C, M, Y and K are formed successively in a repetitive way to form one image. Thus, the color sheet 10 provides one color image by one repeating unit of C, M, Y and K.

This colorant sheet 10 is supplied from a feed roll 81, passed through a laminating roller pair 82 so that it is bonded to the image-receiving material 12 under pressure and heating, thence directed through a transfer unit 85 having a thermal head 83 (as thermal recording means) and a platen roller 84 so that image recording, release from the image-receiving material 12 by means of a strip roller pair 86 and development by transfer onto the image-receiving material 12, and finally wound onto a takeup roll 87.

The image-receiving material 12 is a sheeting having a length that corresponds to one image. It is contained in a cassette 88, from which it is supplied by means of a delivery roller 89. Being guided with a guide member 91, the image-receiving material 12 is transported by transport roller pairs 90 and 92 to pass through the laminating roller pair 82 so that it is bonded to the colorant sheet 10 under pressure and heating. Thereafter, the laminate is transported to the transfer unit 85 having the platen roller 84 which holds the laminated colorant sheet 10 and the image-receiving material 12 in a predetermined image recording position.

It should be noted here that the image-receiving material 12 to be used in the invention is not limited to a sheet and a continuous web of image-receiving material 12 may be wound onto a roll and subsequently cut by a suitable means such as a cutter provided in the color image forming apparatus 80.

Before the image recording operation starts, the thermal head 83 in the transfer unit 85 is in the upper position and the laminate of the colorant sheet 10 and the image-receiving material 12 is at rest. When the laminate is transported to a predetermined position, the thermal head 83 lowers and the laminate is held between the platen roller 84 and the thermal head 83 under a predetermined pressure so that image recording onto the colorant sheet 10 by thermal head 83 is started from the predetermined image recording position. As already mentioned, the bonding force of the colorant layer 22 in the colorant sheet 10 decreases upon heating whereas the image-receiving layer 16 in the image-receiving material 12 is sticky and, hence, the colorant layer 22 becomes readily transferable from the other part of the colorant sheet 10 to form a latent image.

The thermal head 83 has a number of tiny heat generating elements arranged in the recording direction perpendicular to the direction of transport (i.e., normal to the paper). Applying this thermal head 83 onto the colorant sheet 10 being transported, image can be recorded onto the entire surface of the colorant sheet 10. The thermal head 83 is connected to the control unit 51 which controls and drives the thermal head 83. The control unit 51 drives or otherwise controls the respective heat generating elements in the thermal head 83 in response to externally forwarded image signals S.

In the image recording position, the laminate of the colorant sheet 10 and the image-receiving material 12 is pressed onto the platen roller 84 by means of the thermal head 83 to effect image recording. Thereafter, the laminate runs downstream of the image recording position (platen roller 84) in the auxiliary scanning direction (the word "downstream" as used hereunder has this particular meaning) and in that "downstream" position, the peel roller pair 86 depresses the laminate so that the colorant sheet 10 is separated from the image-receiving material 12 while, at the same time, the colorant layer 22 which has undergone a drop in the bonding force is transferred to the image-receiving material 12 from the other part of the colorant sheet 10, thereby effecting transfer to form a monochromatic image on the image-receiving material 12. Subsequently, the colorant sheet 10 is transported upward by means of the takeup roll 87 whereas the image-receiving material 12 is transported downward by means of a transport roller pair 71.

Thus, in the apparatus shown in FIG. 4, the colorant sheet 10 and the image-receiving material 12 are transported from an upstream to a downstream position in the path connecting the laminating roller pair 82, platen roller 84 and peel roller pair 86 in that order, whereby the respective steps of lamination, recording and peeling which are shown in FIGS. 3a–3d are performed to form a monochromatic image on the image-receiving material 12.

As already mentioned, the colorant sheet 10 is a parallel-striped colorant sheet having colorant layers 22 of respective colors C, M, Y and K formed in predetermined lengths successively and in a repetitive manner. If the recording of an image of the first color, say, C, and subsequent transfer of that image onto the image-receiving material 12 end, the transport of the colorant sheet 10 and the image-receiving material 12 stops. Then, the thermal head 83 moves to the upper position and one member of each of the laminating roller pair 82 and the peel roller pair 86 shifts in position, whereby the colorant sheet 10 and the image-receiving material 12 in the laminate in the image recording position are disengaged from each other to become separate. Subsequently, the image-receiving material 12 is transported upstream until it stops in a predetermined position where image recording should start. If necessary, the step of registering the colorant sheet 10 may be performed. Thereafter, the recording of an image of a next color, say M, and subsequent transfer of that image onto the image-receiving material 12 are performed by the same procedure.

Similarly, the recording of images of the remaining colors Y and K and the subsequent transfer of those images onto the image-receiving material 12 are performed to complete a four-color image that has been transferred onto the image-receiving material 12.

When the parallel-striped colorant sheet 10 is to be used as in the case just described above, the laminating roller pair 82 and the peel roller pair 86 are preferably located the closest possible to the thermal head 83. If the colorant sheet 10 and the image-receiving material 12 on the platen roller 84 can be either laminated under pressure and heating or subjected to peeling under compression by means of the thermal head 83 or if it is capable of both, either the laminating roller pair 82 or the peel roller pair 86 or both may be omitted. The thermal fixing roller pair 76 may also be omitted if the laminating roller pair 82 is capable of thermally fixing the laminate of the final receiving sheet 14 and the image-receiving material 12.

When laminating the colorant sheet 10 and the image-receiving material 12, a predetermined tension is preferably applied to both sheets, with the smaller tension being applied to the colorant sheet 10.

As described on the foregoing pages, the image forming system of the invention has a dual thermal printing function, one for laser head recording in a heating mode and the other for thermal recording with a thermal head. In the invention, the light from a laser head can be reduced to a beam spot size of about 10 µm or even smaller to the order of a few microns (e.g., ca. 5–6 µm) while, at the same time, the thickness of the thin film 22 in the colorant sheet 10 can be reduced to less than 1 µm, say, about 0.2–0.4 µm. Hence, in spite of high the overall cost for image formation including equipment cost and despite the long time required for image formation compared to thermal recording with a thermal head, thermal printing with a laser head is capable of providing a high resolution of 1000–4000 dpi that has been unattainable by the prior art. On the other hand, the resistors (heating elements) in the thermal head can be reduced to a size of about 70×50 µm, or even smaller to about 40×40 µm and, at the same time, the feed pitch can be reduced to about 1–3 µm. Hence, at the sacrifice of resolution, thermal recording with the thermal head enables image to be formed at a lower cost and within a shorter time than thermal printing with a laser head. The resolution on the order of 300–600 dpi that can be achieved by thermal head recording is definitely higher than the values heretofore attainable by thermal printers (which may depend on a laser head or a thermal head for operation) using the conventional sublimable or meltable ink sheets.

The system of the invention ensures that whether recording is effected with a laser head or a thermal head, very precise feed can be accomplished to permit complete and precise transfer of the thin film 22 in the colorant sheet 10 onto the image-receiving layer. Hence, the system permits binary (ON/OFF) digital information to be reproduced consistently, thus enabling precise area modulation. Additionally, the complete transferability of the thin film helps the system achieve high S/N ratio, thus enabling the formation of characters and other line images in high quality. Thus, the image forming system according to the third embodiment of the invention is capable of forming either area-modulated images or characters and other line images by selecting an appropriate recording method (with either a laser head or a thermal head) depending upon the required image quality (or the volume of data in the image to be produced, its resolution, cost for image formation or the recording time).

The image forming system of the invention as it relates to an apparatus for forming color image in color proofing as well as a process that is implemented by the apparatus for forming color image has been described above with reference to FIGS. 2–4. The image forming system according to the first embodiment of the invention has an added advantage in that if a plurality of donor sheets are provided by changing the colorant layer 22 in the colorant sheet 10 to thin films adapted for specific objects and uses and if such donor sheets are combined with a corresponding number of image-receiving materials in appropriate ways, at least two image forming operations can be accomplished by using the color image forming apparatus of FIGS. 2 and 4 either as such or with partial modifications being made, and by applying the process shown in FIG. 3 either partly or wholly or with some modification being made.

The image forming system of the invention is capable of various image forming operations including the production of color proofs in the printing area as discussed on the foregoing pages. Additionally, by selecting appropriate colorants, the system is capable of forming not only color images as in color copies (including color prints per se) but also monochromatic images as in black-and-white copies. If appropriate combinations of thin films and image-receiving materials are selected, the system can also perform other operations such as platemaking, filter preparation and PWB fabrication. Platemaking to be performed by the image forming system of the invention relies on lithography. In lithographic platemaking, the donor sheet uses either an oleophilic (ink-receptive) thin film or a water and oil repellent (ink-repulsive) thin film. In the former case, a hydrophilic image-receiving layer has to be used in the image-receiving material; in the latter case, an oleophilic image-receiving layer has to be used. The oleophilic thin film is generally formed of polymers soluble in organic solvents, such as phenolic resins, acrylic resins and styrenic resins. Hydrophilic substances that are advantageously used in combination with oleophilic thin films are water-soluble polymers such as PVA and gelatin. In lithographic platemaking, the image-receiving layer may also serve as a support for the image-receiving material; alternatively, the image-receiving layer that has received the image formed in thin film may be retransferred onto a permanent support such as a metal (e.g. Al) plate. Anodized aluminum is a particularly advantageous material for the permanent support.

Filters to be produced by the practice of the invention include color filters that can transmit or absorb only light at selected wavelengths in the visible range (e.g. cyan, magenta and yellow filters), mosaic filters (for use in LCD and the like) that have color filters formed in a predetermined mosaic pattern, and filters that transmit or absorb light at selected wavelengths in the IR or UV range (e.g. IR and UV filters). Any known donor sheets may be employed if known colorant layers for use in these filters are contained as filter layers. Speaking of colorants for LCD, dyes or pigments having red, green and blue colors may be selected from among known materials and processed by the same method as in the invention to prepare donor sheets. Any image-receiving materials may be used as long as they have transparent image-receiving layers. Thin transparent films onto which filter layers have been transferred may be retransferred onto permanent supports such as glass plates or thick clear resin plates, thereby preparing filters. If the image-receiving layer is integral with the support layer to form a unitary assembly, this may be directly used as a filter after transfer of the thin film in the donor sheet.

The image forming system according to the first embodiment of the invention has the advantage that a single unit of the system can form more than one image by combining, in appropriate ways, a plurality of donor sheets having thin films formed of different materials, with a plurality of image-receiving materials having image-receiving layers made from different materials, and with optional permanent supports. When forming a plurality of images, recording may be performed with either a thermal head or a laser head as in the third embodiment of the invention depending upon the required image resolution, quality and pattern precision.

In the case just described above, the layer arrangements of the donor sheets and the image-receiving materials are not limited in any particular way. Donor sheet 10 needs to have the peelable thin film 22 and the support 18 but it does not have to include light-heat conversion layer 19 or heat-release layer 20. Image-receiving material 12 needs to have the image-receiving layer 16 but it does not have to include cushion layer 28; if desired, the support 26 may be integral with the image-receiving layer 16. The film thicknesses of various layers or components may be selected as appropriate for the specific object and use, and depending upon the means of applying thermal energy (by either a thermal head or a laser head).

In the image forming system of the invention, the image-receiving layer 16 onto which the image-forming thin film 22 has been transferred can be retransferred onto a permanent support (final receiving sheet 14), which can be selected from a broad range of transfer media including various kinds of paper (including not only final printing paper of common grade but also copy paper and OHP paper), films, metal plates such as Al plates typically used in platemaking (the production of PS plates) and plastic (resin) substrates typically used in PWBs.

The image forming system according to the second embodiment of the invention will now be described. The image on prints, color proofs, color copies and other output products from the image recording systems according to the above-described first and third embodiments of the invention may differ in final quality on account of the differences in image signal data due to the differences in the type of originals (e.g. reflection originals, transmission originals, photographs, prints and the quality of paper). Even if the image signal data are identical, the final quality of the image may also differ on account of the differences in image output device or output medium, as exemplified by the differences in the quality of paper and ink species. The image forming system according to the second embodiment of the invention will provide a better approximation of the desired image in spite of those differences by applying a system that guarantees faithful image reproduction including color (i.e., guarantees good image quality from the input to the output stage), namely, a color management system (hereunder abbreviated as "CMS") or a color image preservation system (hereunder abbreviated as "CIPS").

Figure 5:
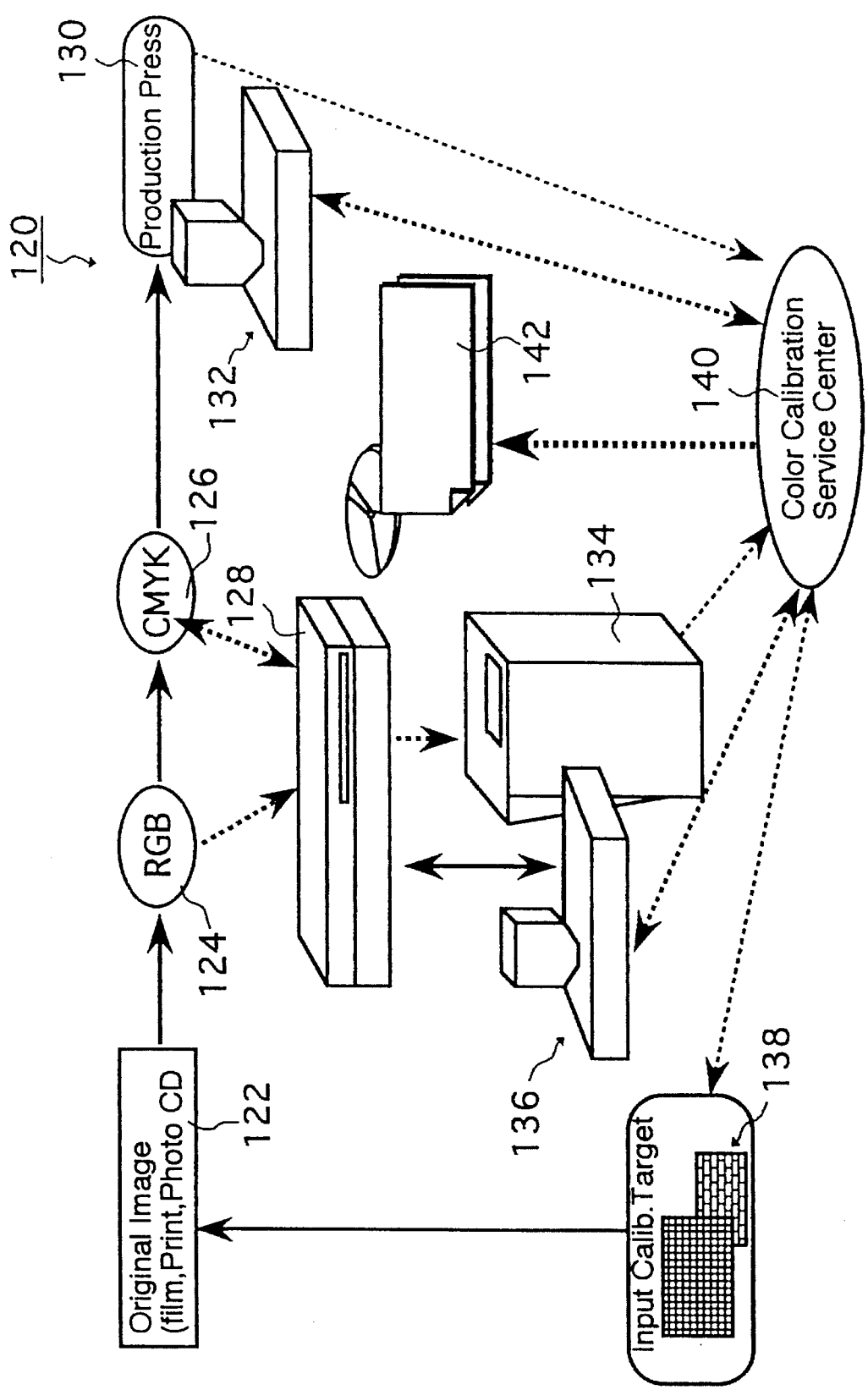
FIG. 5 is an illustration of an example of the overall color image preservation system configuration as combined with the color image forming system of the invention.

FIG. 5 shows schematically an example of the overall CIPS configuration incorporating the image forming system of the invention. The overall CIPS configuration shown by 120 in FIG. 5 comprises the following basic components: CIPS controller 128 by which RGB image data 124 that are read from image 122 on an original such as a photographic film, print or photographic CD are delivered to image input devices, image output media and the like as CMYK image data 126 that have been matched for color space and image structural characteristics; a print calibrator 132 that performs calibration of a production press 130 for each print from the press 130 that is supplied with the CMYK image data 126 to produce prints; a proof printer 134 that produces color proofs in response to output image data signals from the CIPS controller 128; a proof calibrator 136 that performs calibration of the proof printer 134 for the produced color proof; input calibration targets 138 for creating input image signals for calibration; a color calibration service center 140 that accumulates device characters such as the characteristics and capabilities of press 130 and proof printer 134, the differences between the image output conditions and the output image or the values of device characters as corrected by these differences, and the characters of input calibration targets 138 and the like and which performs the service of delivering the accumulated data to individual image output devices as required; and a device character data file 142 for recording and storing the device characters of various I/O devices as stored in the color calibration service center 140, the corrected values thereof, the characters of various I/O calibration targets, etc. Needless to say, the color proof printer 134 in the CIPS 120 shown in FIG. 5 may be configured like the DDCP system 100 shown in FIG. 1 by including not only the image output device 105 such as the color image forming apparatus shown in FIGS. 2 and 4 but also the operation unit 106 having a CRT display such as color monitor 108.

In the CIPS 120 of the invention, CIPS controller 128 is combined with proof printer 134 and proof calibrator 136 or the DDCP system 100 shown in FIG. 1 to provide a device characterization capability, or the ability to simulate not only color information but also image structure related characteristics such as texture, S/N ratio and resolution. Included within the definition of color information are chromaticity and lightness, in particular, hue and chroma. Image structural characteristics include methods of image modulation (or image formation), i.e., the production of high-definition small points, statistic production of halftone dots by FM screening and the production of characters and other line images, as well as the differences in output media, or transfer media such as paper, and optical and/or electrical resolution. In the invention, CIPS insures that various images from different image output devices can be simulated either as display on CRT or as hard copies like color proofs or prints; thus, the operator can predict that image quality covering not only chromaticity but also image structural characteristics can be held at levels higher than what is appropriate for a specific image output device, particularly the printing press. Therefore, the invention can offer an apparatus that forms images of a very good approximation of what can be expected on the press.

Figure 6:
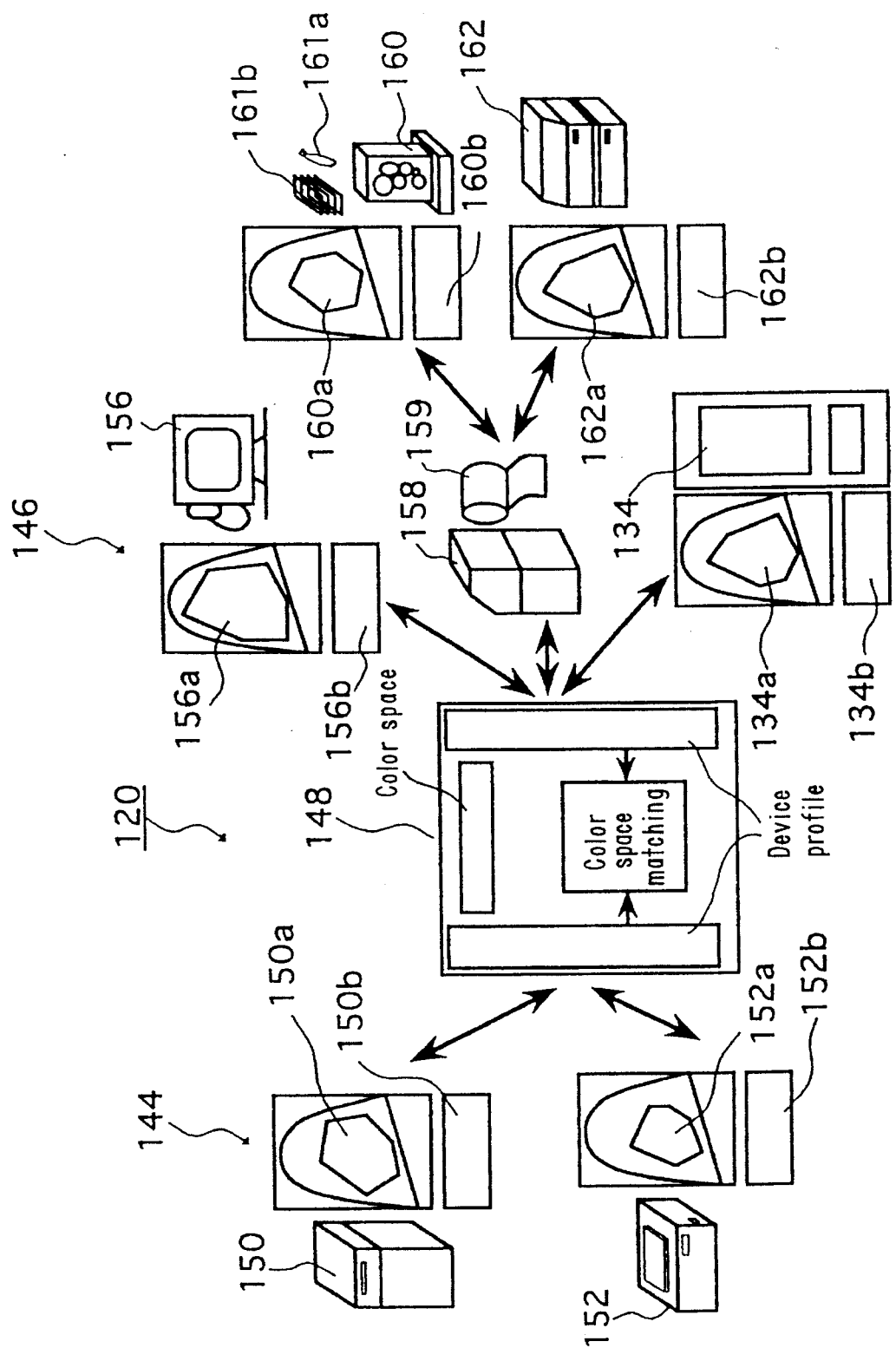
FIG. 6 is an illustration of another example of the color image preservation system as combined with the color image forming system of the invention.

FIG. 6 shows schematically image input devices 144, image output devices 146 and a CMS unit 148 which performs color management between the two sections. In the following description, color reproduction by color space matching is discussed as a typical example of the color management by CIPS; however, this is not the sole case of the invention and it is of course within the scope of the invention to perform color management by the matching of image structure associated characteristics such as texture, S/N ratio and resolution.

The image input devices 144 may include a transmission original (reading) scanner 150, a reflection original (reading) scanner 152, as well as digital image data storage and/or generator (not shown) including photographic CDs. These image input devices have their own reading color spaces 150a and 152a, as well as device profiles 150b and 152b.

Color space 150a for the transmission original reading scanner is shown to be fairly wide; on the other hand, the reading color space 152a for the reflection original scanner is shown to be narrow since reflection originals use limited colorants.

The image output devices 146 may include a monitor CRT display unit 156, the proof printer 134 constituting the DDCP system 100 of the invention; a press 160 that performs printing on a plate such as a PS plate made by using color separation films (Y, M and C or Y, M, C and K) 159 produced from image data by means of a color separation film platemaker (film recorder) 158; and a conventional color proofer 162 that produces color proofs (off-press proofs) using color separation films 159. Other image output devices that may be included are: a proofer that makes plates such as PS plates using platemaking films 159 as in the case of the press 160 and which then performs proof printing using ink 161a and paper 161b similar to those employed in printing with the press 160; and a DDPP (direct digital printing press) image output device that makes plates such as PS plates direct from image data without using platemaking films 159 and which similarly performs printing with the press 160.

These image output devices 146 also have their own reproducible color spaces 156a, 134a, 160a and 162a, as well as device profiles 156b, 134b, 160b and 162b. Obviously, the color space 156a which is reproducible on the CRT display unit is the widest and the color spaces 134a and 162a for producing DDCP proofs and conventional color proofs are also fairly wide; however, the color space 160a for the press using an ink is considerably narrow compared to the other color spaces.

Thus, the color spaces that can be read and those which permit color reproduction differ from each other as the types of image input devices 144 and input originals, as well as the types of image output devices 146 and output media vary. Therefore, in the CMS unit 148, color space matching is performed both with reference to the device profile for a selected image input device 144 and the device profile for a particular image output device 146, so that the faithful color reproduction of an original image by the image output device 146 is enhanced to assure even better color reproduction by visual inspection.

Figure 7:
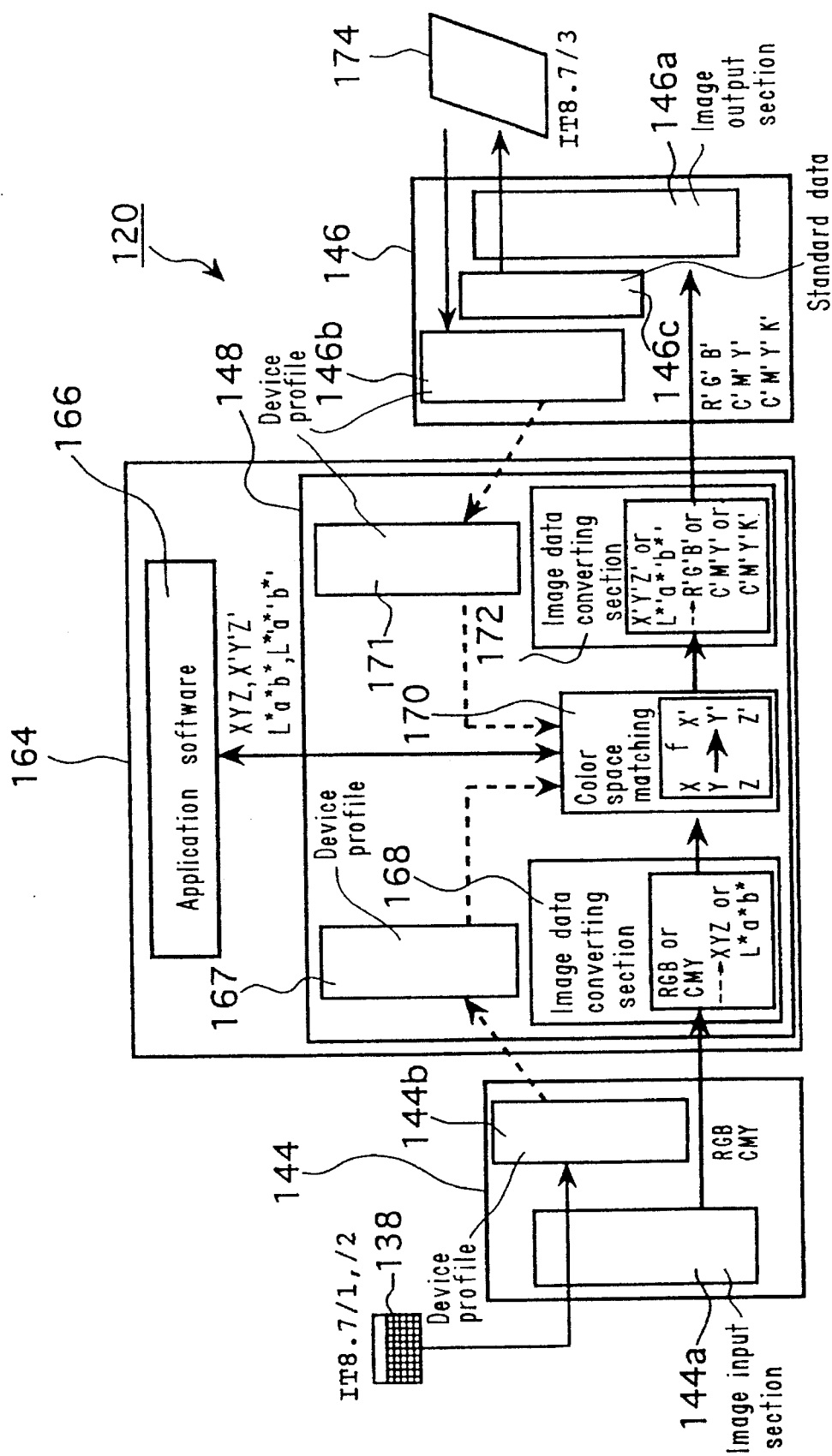
FIG. 7 is an illustration of yet another example of the color image preservation system as combined with the color image forming system of the invention.

Greater details of color management by the CIPS 120 of the invention are shown in FIG. 7. Referring to FIG. 7, the image input device 144 comprises an image input section 144a and a memory storing a device profile 144b. The device profile 144b for the device 144 may be generated by reading standard input targets 138, such as IT8.7/1 or IT8.7/2 via the image input section 144a, or the device profile 144a for the same device which is preliminarily stored in the memory may be used as such, or the device profile 144b may be modified by calibration using standard input targets 138.

An image processing workstation (W/S) indicated by 164 comprises the CMS processing unit 148 and a memory storing application software 166. The CMS processing unit 148 in turn comprises a memory storing an input device profile 167, an input image data converting section 168, a color space processing section 170, a memory storing an output device profile 171 and an output image data converting section 172.

Input device profile 167 may be the device profile 144b that is supplied as data from the image input device 144; alternatively, the operator of W/S 164 may designate or select a particular model of the image input device 144 so as to select a suitable input device profile from among the plurality of device profiles for image input devices 144 that are preliminarily stored in the CMS processing section 148 or W/S 164. Similarly, the output device profile 171 may be the device profile 146b being supplied from the image output device 146 or, alternatively, a suitable output device profile may be selected from the plurality of preliminarily stored device profiles for image output devices 146 in accordance with a selected model of the image output device 146.

Original image data read by the image input unit 144a in the image input device 144 are converted to image signal data for RGB (data on the quantity of light) or CMY (density data) and are thereafter transmitted to the image data converting section 168 in the CMS processing unit 148. In the image data converting section 168, the input RGB or CMY image signal data are transformed, with reference to the input device profile 167, to XYZ or L*a*b* image signal data in common color spaces that are independent of the image I/O devices and output medium, as exemplified by the CIE, XYZ or L*a*b* colorimetric system or the YCC, YIQ or other colorimetric systems. Subsequently, in those common color spaces, color space matching is performed on the image I/O devices using the application software 166 with reference to the input and output device profiles 167 and 171, so that the input XYZ or L*a*b* image signal data are transformed to color space matched, output X'Y'Z' or L*'a*'b*' image signal data.

Thereafter, the output X'Y'Z' or L*'a*'b*' image signal data are transmitted to the output image converting section 172, where they are transformed to R'G'B' or C'M'Y' or C'M'Y'K' image signal data with reference to the output device profile 171, and those data are then transmitted to the image output device 146.

The image output device 146 has an image output section 146a, a device profile 146b, and a memory storing standard data 146c. The device profile 146b may preliminarily be stored in a memory; preferably, standard data 146c are used to output the device profile 146b as a hard copy via the image output section 146a and then calibrated with standard output targets 174, such as IT8.7/3, to generate a new device profile. Alternatively, the preliminarily stored device profile may be used after modification.

The image output section 146a outputs a hard copy on the basis of the color space matched R'G'B' or C'M'Y' or C'M'Y'K' image signal data that have been transmitted from the output image converting section 172 in the CMS processing unit 148 in the image processing W/S 164. In the invention, matching is done in the CMS processing unit 148 in the W/S 164 by performing simulations and the like not only on color spaces but also on image structural characteristics. Hence, the hard copy produced is a color proof that is a good approximation of the final print and its image quality is maintained above a certain level irrespective of the image output device and output medium used.

In the invention, device profiles that describe the characteristics and capabilities of image I/O devices, I/O media and the like and which are used to effect matching of not only chromaticity but also other characteristics such as image structures have their data programmed by interleaving. For color space matching, color space data are transformed between the inherent color spaces of image I/O devices and the CIE standard color spaces, namely, common color spaces. For transformation of input image data, one may employ matrix procedures (3×10 matrixing and 3×3 matrixing), the LUT procedure (three-dimensional table look-up) and direct mapping. For transformation to output image data, one may employ halftone modulation with Neugebauer's equation, transformation with a LUT, and direct mapping.

It should also be noted that for color space matching, the color reproduction zone of an image input device in a CIE standard color space is compressed, transformed or otherwise processed to the color reproduction zone of a desired image output device and, in addition, appearance adjustments are made considering the differences in conditions for observation. These processes are performed by means of color reproduction zone and appearance transforming tables, which are constructed by procedures for color reproduction that comprise the LMN transformation of PostScript tristimulus values and the associated LMN transformation matrices and nonlinear transformation tables.

For details of the applicable methods of color data transformation and the color reproducing procedures for color space matching, see the specification of commonly assigned EP-A-648,042.

The CIPS to be used in the invention may be the color reproducing system that is described in EP-A-648,042, supra. The disclosed color reproducing system is such that color image data supplied from an image input device are processed by a color reproducing procedure associated with the input conditions of said image input device, the output conditions of a selected image output device and the like, with a color image being reproduced and output from said image output device. The system includes a basic profile in which a color reproduction procedure associated with I/O conditions is set in terms of at least one color space data transformation formula, a subprofile that sets a relation optionally selectable in accordance with the variables in said space data transformation formula or parameters associated with this relation and I/O conditions, and a conditional profile that sets parameters associated with the I/O conditions for said image input and output devices. The system is further characterized in that a specified color space data transformation formula is selected from said basic profile in accordance with the color reproduction procedure while, at the same time, said relation and said parameters associated with said selected color space data transformation formula are selected from said subprofile or from both said subprofile and said conditional parameters so that color reproduction processing is performed on said color image data based on said color space data transformation formula, said relation and said parameters.

In a preferred embodiment, the subprofile includes a low-order subprofile that sets another relation or parameters selectable in accordance with said relation.

While the image forming system of the invention has been described above in detail with reference to the preferred embodiments, it should be understood that the invention is by no means limited to those particular embodiments and that various improvements and modifications can be made without departing from the spirit and scope of the invention.

As described in detail on the foregoing pages, the system of the invention is characterized in that a donor sheet having a peelable thin film and an image-receiving material having an image-receiving layer are laminated and given thermal energy to record an image and that, thereafter, the adhering donor sheet is peeled from the image-receiving material to form the recorded image. If a properly selected thin film in the donor sheet is combined with a properly selected image-receiving layer in the image-receiving material, and optionally with a permanent support, different products such as full color images, monochromatic images, plates, filters and PWBs can be yielded by the same image forming apparatus. Additionally, the thin film in the donor sheet has such a small thickness compared to the conventional meltable and sublimable ink sheets that it can be completely transferred onto the receiving layer in the receiving material. Hence, the invention assures that digital information in a binary (ON/OFF) data format can be reproduced consistently, that area modulation is possible with high definition and that characters and other line images can be finished to high quality in high S/N ratio.

Further in accordance with the invention, the image formed on a dedicated image-receiving material can automatically be retransferred onto a separate sheet or a permanent support and, hence, an image can be formed onto rigid materials such as metal plates, plastic plates and glass plates.

Additionally, the system of the invention is based on a fully dry processing and, hence, the need to perform wet development processing is obviated to insure the production of images that are a good approximation of what can be expected on a press.

The system of the invention also has a device characterization capability that enables various images to be simulated by CIPS and, hence, the operator can predict as to whether the desired image quality (covering not only chromaticity but also the image structure) will be maintained.

It is also possible for the system of the invention to select an appropriate recording method that suits the desired image quality, cost and speed.

If a cushion layer is incorporated in the image-receiving material, dust and other objectionable matter can be trapped and this enables the image forming process to be performed in a manner reasonably insensitive to dust and other objectionable matter.

If the invention is applied to a DDCP producing system, a hard copy of color image can be produced in the manner described above and it is particularly useful as a color proof in the printing area.

If a laser head is to be used as recording means, a light-heat conversion layer for absorbing laser light is provided as a separate entity from the thin-film layer on which an image is to be formed. Because of this feature of functional separation, the laser light absorber in the light-heat conversion layer will not cause any coloration during transfer and, without dependency of color on the wavelength of laser light, multi-colors can be formed with a laser operating at a single wavelength and this provides great latitude in laser selection.

What is claimed is:

1. An image forming process comprising the steps of:

superposing a donor sheet having at least a thin image-forming film on a support upon an image-receiving material having an image-receiving layer provided on a support either directly or with at least one cushion layer interposed so that said thin image-forming film faces said image-receiving layer;

applying thermal energy imagewise onto said donor sheet so that the adhesion of said thin image-forming film to said image-receiving layer is strengthened in the energy applied areas; and peeling said donor sheet from said image-receiving material so that said thin image-forming film is transferred onto said image-receiving layer in correspondence to said imagewise application of energy, whereby an image is formed on said image-receiving material;

wherein prior to the step of superposing, selecting said donor sheet from a plurality of donor sheets, with each of said donor sheets having a thin image-forming film so that said plurality of donor sheets in turn provides a plurality of thin image-forming films containing different substances to be used in combination with said image-receiving material which is selected from a plurality of different image-receiving materials, thereby insuring that at least two operations selected from among color image formation, mask image formation, platemaking and filter preparation are possible.

2. An image forming process according to claim 1, wherein the thin image-forming film in each of said plurality of donor sheets has a thickness of 0.1–2 μm.

3. An image forming process according to claim 1, wherein one of said plurality of donor sheets is a colorant sheet and the thin image-forming film in said colorant sheet contains a colorant and a thermoplastic resin as two main components.

4. An image forming process according to claim 1, further comprising the step of simulating color information and also at least one image structural characteristic selected from among texture, S/N ratio and resolution.

5. An image forming process according to claim 4, wherein the simulation step is performed optically and/or electrically.

6. An image forming process according to claim 1, further comprising the step of forming one of an area-modulated image and a character/line image by controlling the application of thermal energy to select between laser head recording in a heating mode or thermal recording with a thermal head in accordance with the quality of the image to be formed.

7. An image forming process according to claim 1, further comprising retransferring the image received by the image-receiving layer in said image-receiving material onto a separate permanent support.

* * * * *